United States Patent
Lee et al.

(10) Patent No.: US 12,250,826 B2
(45) Date of Patent: Mar. 11, 2025

(54) INTEGRATED CIRCUIT DEVICE AND METHOD FOR FABRICATING THE SAME

(71) Applicant: TAIWAN SEMICONDUCTOR MANUFACTURING COMPANY, LTD., Hsinchu (TW)

(72) Inventors: Yuan-Jen Lee, Hsinchu (TW); Harry-Hak-Lay Chuang, Hsinchu County (TW); Tien-Wei Chiang, Taipei (TW); Hung Cho Wang, Taipei (TW); Kuei-Hung Shen, Hsinchu (TW); Sheng-Huang Huang, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 660 days.

(21) Appl. No.: 17/460,885

(22) Filed: Aug. 30, 2021

(65) Prior Publication Data
US 2023/0065850 A1   Mar. 2, 2023

(51) Int. Cl.
*H10B 61/00* (2023.01)
*H10N 50/01* (2023.01)
*H10N 50/80* (2023.01)

(52) U.S. Cl.
CPC ............ *H10B 61/00* (2023.02); *H10N 50/01* (2023.02); *H10N 50/80* (2023.02)

(58) Field of Classification Search
CPC ......... H10B 61/00; H10N 50/80; H10N 50/01
See application file for complete search history.

(56) References Cited

U.S. PATENT DOCUMENTS

| | | | |
|---|---|---|---|
| 2019/0165258 A1* | 5/2019 | Peng | H10N 50/10 |
| 2020/0212298 A1* | 7/2020 | Yang | H10N 50/85 |
| 2021/0091139 A1* | 3/2021 | Tseng | H10N 50/01 |
| 2023/0058218 A1* | 2/2023 | Ok | H10N 70/8413 |

OTHER PUBLICATIONS

Wang et al., "Impact of External Magnetic Field on Embedded Perpendicular STT-MRAM Technology Qualified for Solder Reflow", 2017 IEEE International Electron Devices Meeting (IEDM), 2017, total 5 pages.

* cited by examiner

*Primary Examiner* — Christine A Enad
(74) *Attorney, Agent, or Firm* — Birch, Stewart, Kolasch & Birch, LLP

(57) ABSTRACT

An integrated circuit device includes a substrate, a memory cell, a magnetic shielding element, an interlayer dielectric layer, and a metallization pattern. The memory cell is over the substrate. The memory cell includes a bottom electrode, a resistance switching element over the bottom electrode, a top electrode over the resistance switching element. The magnetic shielding element is around the memory cell. The interlayer dielectric layer surrounds the memory cell and the magnetic shielding element. The metallization pattern is in the interlayer dielectric layer and connected to the top electrode.

20 Claims, 25 Drawing Sheets

INTEGRATED CIRCUIT DEVICE AND METHOD FOR FABRICATING THE SAME

BACKGROUND

Semiconductor memories are used in integrated circuits for electronic applications, including radios, televisions, cell phones, and personal computing devices, as examples. One type of semiconductor memory device involves spin electronics, which combines semiconductor technology and magnetic materials and devices. The spins of electrons, through their magnetic moments, rather than the charge of the electrons, are used to indicate a bit.

One such spin electronic device is magnetoresistive random access memory (MRAM) array, which includes conductive lines (word lines and bit lines) positioned in different directions, e.g., perpendicular to each other in different metal layers. The conductive lines sandwich a magnetic tunnel junction (MTJ), which functions as a magnetic memory cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
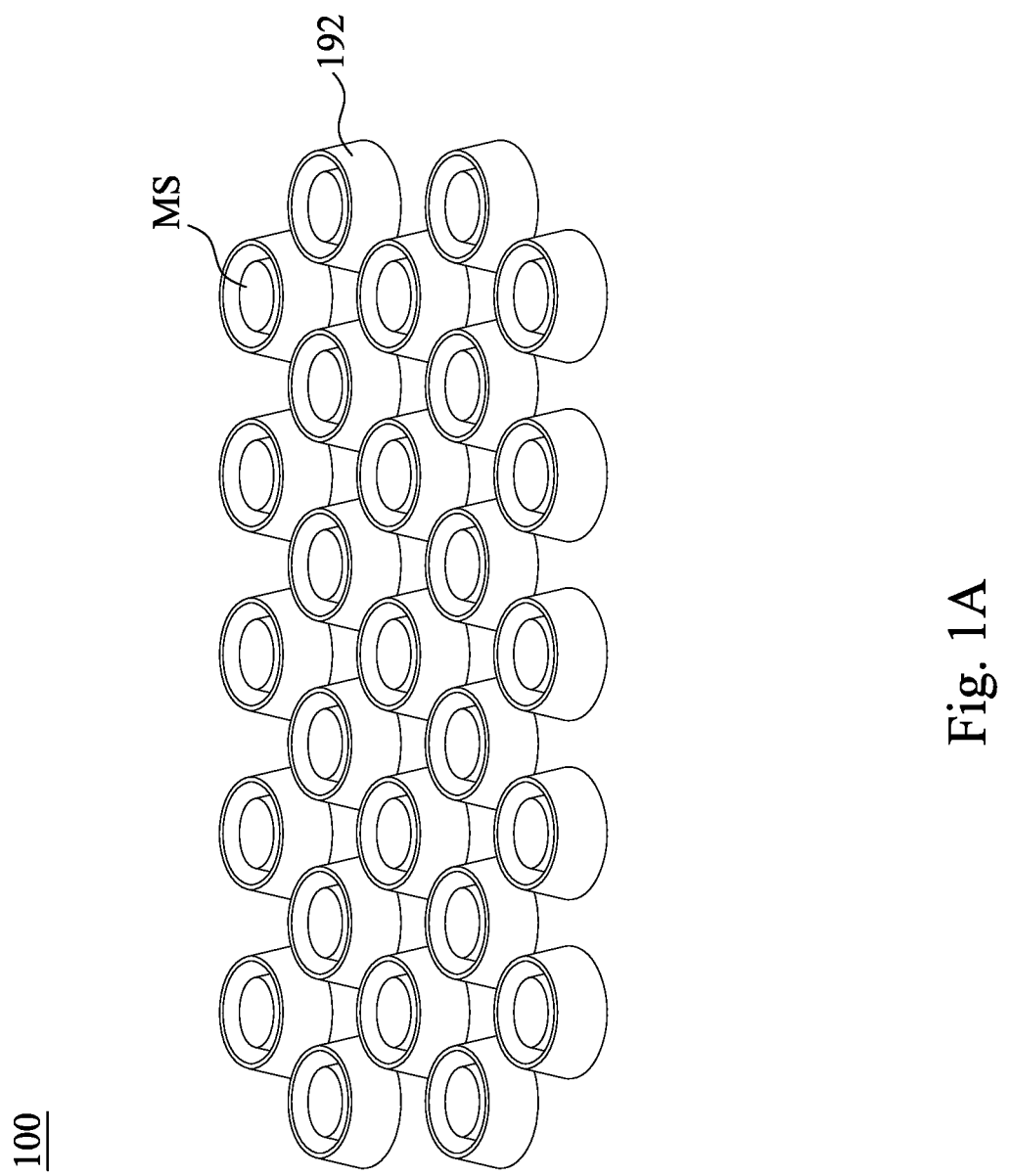
FIG. 1A is a schematic view of an integrated circuit device having memory cells in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A magnetic tunnel junction (MTJ) includes first and second ferromagnetic films separated by a tunnel barrier layer. One of the ferromagnetic films (e.g., referred to as a "reference layer") has a fixed magnetization direction, while the other ferromagnetic film (e.g., referred to as a "free layer") has a variable magnetization direction. For MTJs with positive tunneling magnetoresistance (TMR), if the magnetization directions of the reference layer and free layer are in a parallel orientation, it is more likely that electrons will tunnel through the tunnel barrier layer, such that the MTJ is in a low-resistance state. Conversely, if the magnetization directions of the reference layer and free layer are in an anti-parallel orientation, it is less likely that electrons will tunnel through the tunnel barrier layer, such that the MTJ is in a high-resistance state. Consequently, the MTJ can be switched between two states of electrical resistance, a first state with a low resistance (RP: magnetization directions of reference layer and free layer are parallel) and a second state with a high resistance (RAP: magnetization directions of reference layer and free layer are anti-parallel). It is noted that MTJs can also have a negative TMR, e.g., lower resistance for anti-parallel orientation and higher resistance for parallel orientation.

Because of their binary nature, MTJs are used in memory cells to store digital data, with the low resistance state RP corresponding to a first data state (e.g., logical "0"), and the high-resistance state RAP corresponding to a second data state (e.g., logical "1"). For example, plural MRAM cells are arrayed in a chip, and each MRAM cell makes use of an MTJ to store a data state. However, when the chip comes under the presence of an external magnetic field, the chip may experience external turbulent of the external magnetic field, which may undesirably "flip" the data states stored in the MRAM cells, leading to data retention problems. External magnetic field could cause the operation window shift or storage data error, hence resulting in device reading or writing failure. Also, magnetic field may be generated by the MRAM cells may cause in-cell magnetic cross talk. For example, currents through one of the MRAM cells may generate magnetic field, which may undesirably "flip" the data states stored adjacent one of the MRAM cells.

In some embodiments of the present disclosure, to mitigate the adverse effects of external turbulent and in-cell magnetic cross talk, magnetic shielding elements are respectively inserted to spacers surrounding the MTJs. The magnetically-shielded zone, which lies within the magnetic shielding elements, has a first magnetic field magnitude that is less than a second magnetic field magnitude immediately outside of an outermost surface of the magnetic shielding elements. Thus, the magnetic shielding elements reduces the magnetic field experienced by the MRAM cells, thereby helping to improve data retention within the MRAM cells.

A magnetic random-access memory (MRAM) device and the method of forming the same are provided in accordance with various exemplary embodiments. The intermediate stages of forming the MRAM device are illustrated. The variations of the embodiments are discussed. Throughout the various views and illustrative embodiments, like reference numbers are used to designate like elements.

FIG. 1A is a schematic view of an integrated circuit device 100 having memory cells in accordance with some embodiments of the present disclosure. Magnetic shielding elements 192 are respectively disposed to surrounding memory cells MC, thereby shielding the memory cells MC and mitigating the adverse effects of external turbulent and in-cell magnetic cross talk.

Figure 1B:
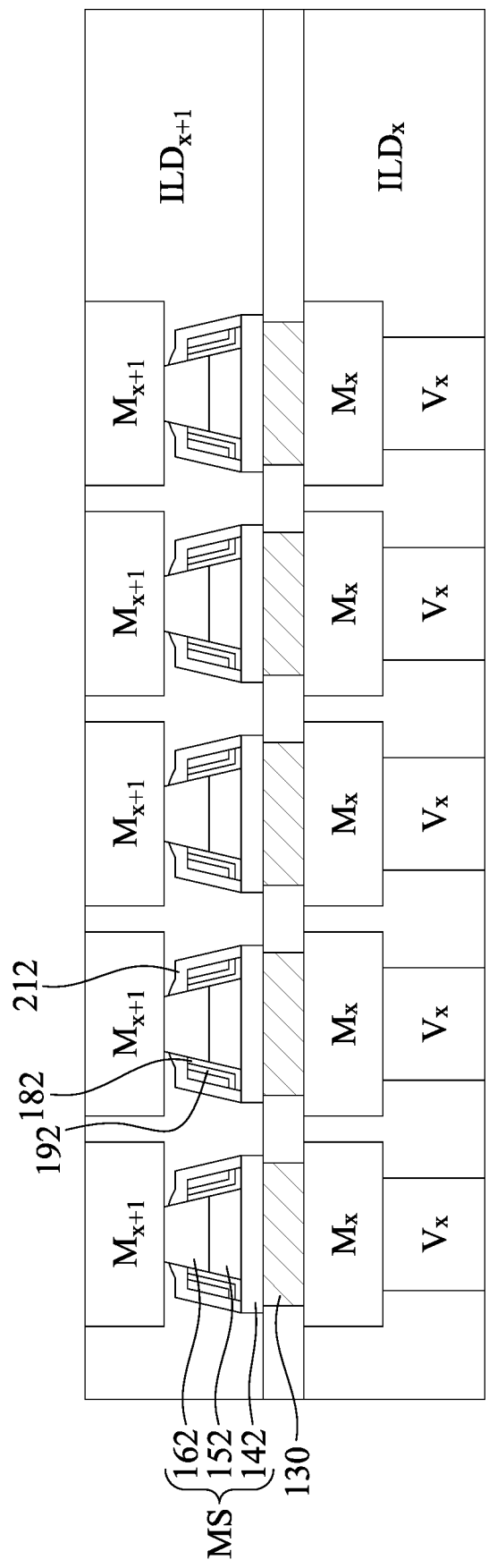
FIG. 1B is a schematic cross-sectional view of the integrated circuit device of FIG. 1A.

FIG. 1B is a schematic cross-sectional view of the integrated circuit device 100 of FIG. 1A. The memory cells MC are arrayed and disposed between a metallization layer $M_x$ over vias $V_x$ and a metallization layer $M_{x+1}$ above the metallization layer $M_x$. Each of the memory cells MC may include a bottom electrode 142, a resistance switching element 152 over the bottom electrode 142, a top electrode 162 over the resistance switching element 152. The magnetic shielding elements 192 may be conductive, and designed not to establish an electrical connection between the metallization layer $M_x$, and the metallization layer $M_{x+1}$. For example, suitable elements may be used to space the magnetic shielding elements 192 apart from the memory cells MC, the metallization layer $M_x$, and the metallization layer $M_{x+1}$. For example, herein, the spacers 182 are used to space the magnetic shielding elements 192 apart from the resistance switching element 152 and the top electrode 162 of the memory cells MC. In some embodiments, ILD layers, identified as $ILD_x$ and $ILD_{x+1}$, respectively surrounds the metallization layer $M_x$ and the metallization layer Mx+1.

Through the configuration of the magnetic shielding elements 192, the magnetic field flux/lines, which may result from the external turbulent and in-cell magnetic cross talk, may be directed to pass through the magnetic shielding elements 192. Few or no magnetic field flux/lines pass through memory cells MC. Therefore, the configuration of the magnetic shielding elements 192 reduces the magnetic field experienced by the memory cells MC, thereby helping to improve data retention within the memory cells MC.

In some embodiments, for effectively shielding the memory cells MC from magnetic field, a thickness of the magnetic shielding elements 192 may be in a range from about 10 nanometers to about 200 nanometers. If the thickness of the magnetic shielding elements 192 is less than about 10 nanometers, the magnetic shielding elements 192 may not effectively shield memory cells from magnetic field. If the thickness of the magnetic shielding elements 192 is greater than about 200 nanometers, the difficulty of fabrication process of the device may increase.

In some embodiments, for effectively shielding the memory cells MC from magnetic field, a distance between the magnetic shielding elements 192 and the resistance switching element 152 of the memory cells MC (e.g., the thickness of the spacer 182) may be in a range from about 50 angstroms to about 100 angstroms. If the distance between the magnetic shielding elements 192 and the memory cells MC (e.g., the thickness of the spacer 182) is less than about 50 angstroms, due to process limitation, it may be hard to control the distance (e.g., the thickness of the spacer 182) to effectively electrically isolate the magnetic shielding elements 192 from the memory cells MC. If the distance between the magnetic shielding elements 192 and the memory cells MC is greater than about 100 angstroms, the magnetic shielding elements 192 may not effectively shield memory cells from external turbulent and in-cell magnetic cross talk.

In the present embodiments, the memory cells MC are electrically connected to the metallization layer $M_x$ through BEVAs 130. In some other embodiments, the memory cells MC may be directly connected to the metallization layer $M_x$ without the BEVAs 130 disposed therebetween. The memory cells MC may be fabricated by various process, and does not necessarily include the structure shown in embodiments of the present disclosure.

FIGS. 2 through 13 are cross-sectional views of an integrated circuit device in various stages of fabrication in accordance with some embodiments of the present disclosure. The illustration is merely exemplary and is not intended to limit beyond what is specifically recited in the claims that follow. It is understood that additional operations may be provided before, during, and after the operations shown by FIGS. 2-14, and some of the operations described below can be replaced or eliminated for additional embodiments of the method. The order of the operations/processes may be interchangeable.

Figure 2:
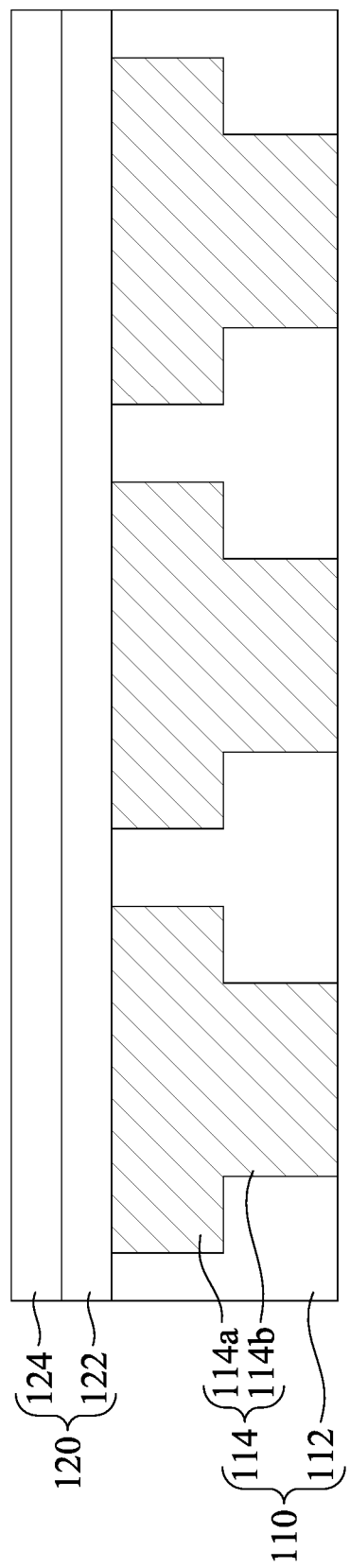
FIGS. 2 through 13 are cross-sectional views of an integrated circuit device in various stages of fabrication in accordance with some embodiments of the present disclosure.

FIG. 2 illustrates a wafer having a substrate having an interconnect layer 110 thereon. The interconnect layer 110 includes an interlayer dielectric (ILD) layer or inter-metal dielectric (IMD) layer 112 with metallization pattern 114 therein. The ILD layer 112 may be an extra low-k dielectric (ELK) layer, such as carbon doped silicon dioxide, may be an oxide, such as silicon oxide, and/or may be the like or a combination thereof. In some embodiments, the ILD layer 112 may be formed of a low-k dielectric material having a k value less than about 3.9. The k value of the ILD layer 112 may even be lower than about 2.8. The metallization pattern 114 may be copper, aluminum, the like, and/or a combination thereof. For example, the metallization pattern 114 includes a conductive via 114a and a conductive line/pad 114b over the conductive via 114a in the present embodiments. The substrate may also include active and passive devices, for example, underlying the interconnect layer 110. These further components are omitted from the figures for clarity, and how these components are formed will be readily apparent to a person having ordinary skill in the art.

A dielectric layer 120 is formed over the interconnect layer 110. The dielectric layer 120 in some embodiments is silicon carbide (SiC), silicon oxynitride (SiON), silicon nitride (SiN), silicon dioxide, the like, and/or combinations thereof. The dielectric layer 120 may be a single-layered structure or a multi-layered structure. For example, herein, the dielectric layer 120 includes a silicon carbide layer 122 and a silicon-rich oxide (SRO) layer 124 over the silicon carbide layer 122. The dielectric layer 120 may be formed by acceptable deposition techniques, such as chemical vapor deposition (CVD), atomic layer deposition (ALD), physical vapor deposition (PVD), the like, and/or a combination thereof.

Figure 3:
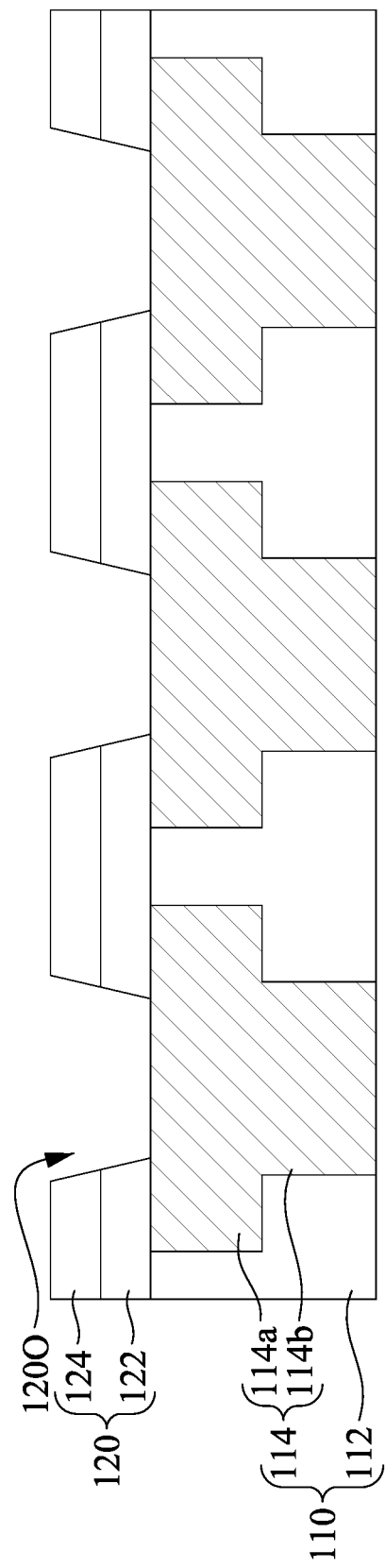

Reference is made to FIG. 3. Plural via openings 1200 are etched in the dielectric layer 120 to expose the conductive line/pad 114b of the metallization pattern 114. In some embodiments, the metallization pattern 114 may have a higher etch resistance to the etch process, such that the metallization pattern 114 remains substantially intact after the second etching process.

Figure 4:
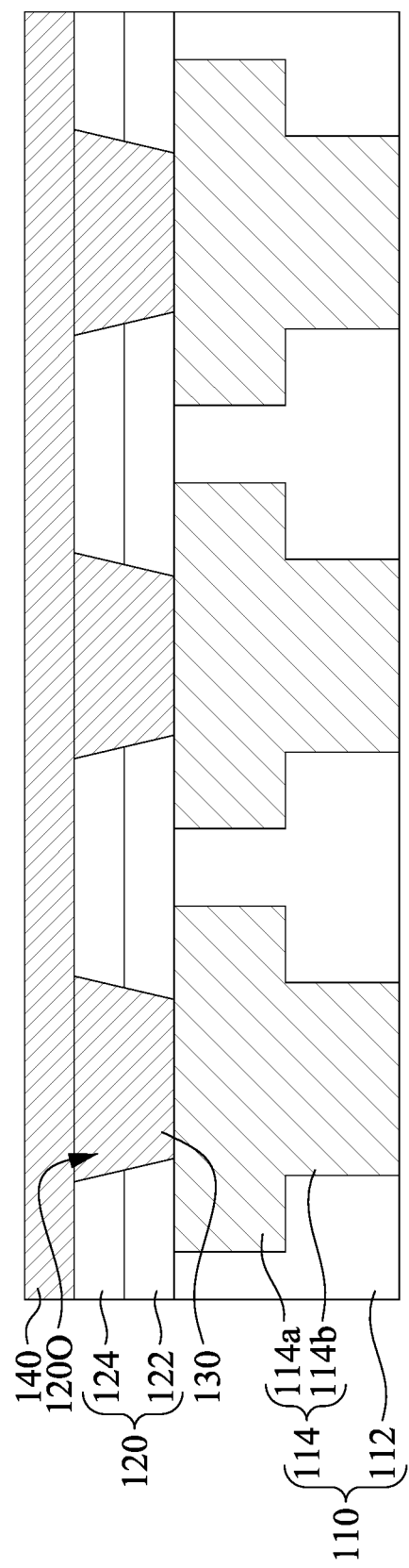

Reference is made to FIG. 4. Bottom electrode vias (BEVA) 130 are then formed in the via opening 1200 in the dielectric layer 120. In the present embodiments, the via openings 1200 in the dielectric layer 120 are overfilled with a fill metal, and then a planarization process, such as a chemical-mechanical polish (CMP) process, is performed to remove excess materials of the fill metal outside the via openings 1200 in the dielectric layer 120. The remaining fill metal in the via openings 1200 in the dielectric layer 120 can serve as the BEVAs 130. In some embodiments, the BEVAs 130 are electrically connected to an underlying electrical component, such as a transistor, through the metallization pattern 114.

In some embodiments, at least one of the BEVAs 130 is a multi-layered structure and includes, for example, a diffusion barrier layer and a filling metal filling a recess in the diffusion barrier layer. In some embodiments, the diffusion barrier layer is a titanium nitride (TiN) layer or a tantalum nitride (TaN) layer, which can act as a suitable barrier to prevent metal diffusion. Formation of the diffusion barrier layer may be exemplarily performed using CVD, PVD, ALD, the like, and/or a combination thereof. In some embodiments, the filling metal is titanium (Ti), tantalum (Ta), platinum (Pt), ruthenium (Ru), tungsten (W), aluminum (Al), copper (Cu), TiN, TaN, the like, and/or combinations thereof. Formation of the filling metal may be exemplarily performed using CVD, PVD, ALD, the like, and/or a combination thereof.

A blanket bottom electrode layer 140 is then formed over the BEVAs 130 and over the dielectric layer 120, so that the bottom electrode layer 140 extends along top surfaces of the BEVAs 130 and of the dielectric layer 120. In some embodiments, the bottom electrode layer 140 may include titanium (Ti), tantalum (Ta), platinum (Pt), ruthenium (Ru), tungsten (W), aluminum (Al), copper (Cu), TiN, TaN, the like, and/or a combination thereof. The bottom electrode layer 140 can be a single-layered structure or a multi-layered structure. For example, the bottom electrode layer 140 may include a TaN layer and a TiN layer over the TaN layer. Formation of the bottom electrode layer 140 may be exemplarily performed using CVD, PVD, ALD, the like, and/or a combination thereof.

In the present embodiments, the bottom electrode layer 140 is electrically connected to the metallization pattern 114 through the BEVAs 130. In some other embodiments, the BEVAs 130 may be omitted, and the bottom electrode layer 140 may be deposited (for example, into the via openings 1200 in the dielectric layer 120) to be in direct contact with the metallization pattern 114.

Figure 5:
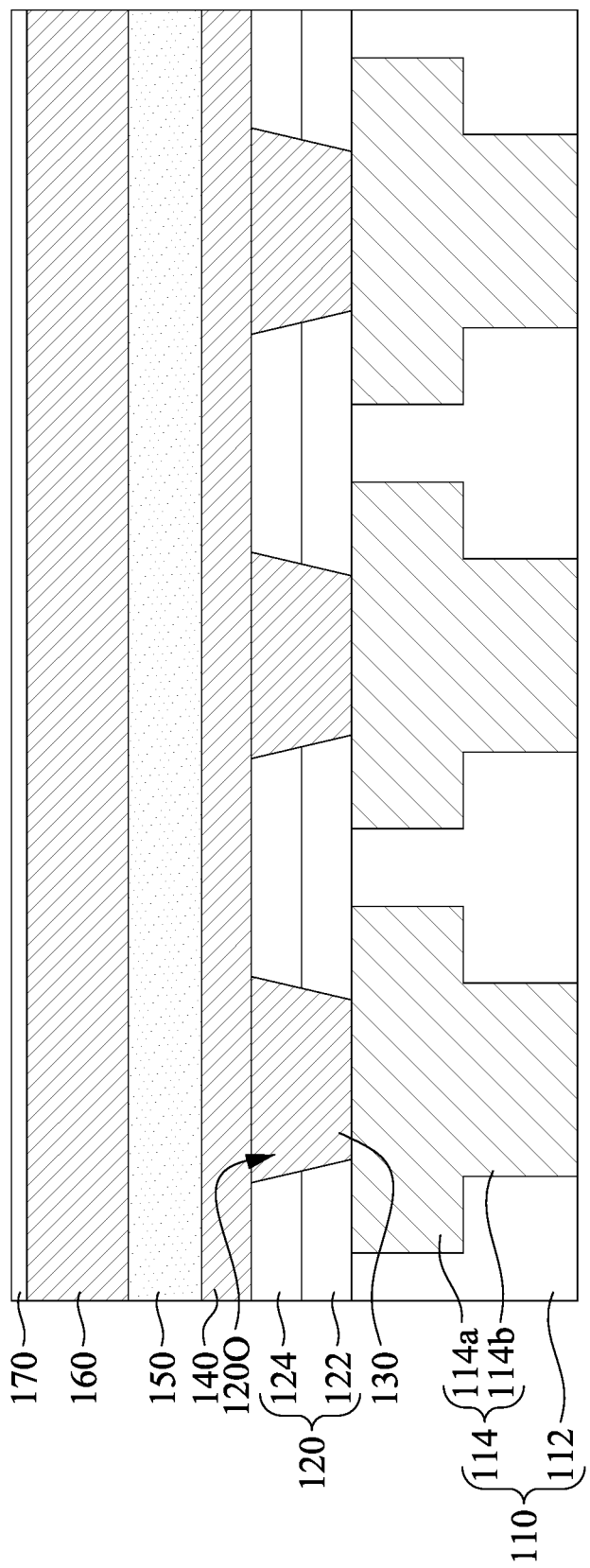

Reference is made to FIG. 5. A resistance switching layer 150, a top electrode layer 160, and a metal-containing mask layer 170 are formed over the bottom electrode layer 140 in a sequence.

In some embodiments, the resistance switching layer 150 may be a magnetic tunnel junction (MTJ) structure. To be specific, the resistance switching layer 150 includes at least a first magnetic layer, a tunnel barrier layer and a second magnetic layer formed in sequence over the bottom electrode layer 140.

In some embodiments, the first magnetic layer includes an anti-ferromagnetic material (AFM) layer over the bottom electrode layer 140 and a ferromagnetic pinned layer over the AFM layer. In the AFM layer, magnetic moments of atoms (or molecules) align in a regular pattern with magnetic moments of neighboring atoms (or molecules) in opposite directions. A net magnetic moment of the AFM layer is zero. In certain embodiments, the AFM layer includes platinum manganese (PtMn). In some embodiments, the AFM layer includes iridium manganese (IrMn), rhodium manganese (RhMn), iron manganese (FeMn), or OsMn. An exemplary formation method of the AFM layer includes sputtering, PVD, ALD, e-beam or thermal evaporation, or the like.

The ferromagnetic pinned layer in the first magnetic layer forms a permanent magnet and exhibits strong interactions with magnets. A direction of a magnetic moment of the ferromagnetic pinned layer can be pinned by the AFM layer and is not changed during operation of a resulting resistance switching element (e.g. a MTJ stack) fabricated from the resistance switching layer 150. In certain embodiments, the ferromagnetic pinned layer includes cobalt-iron-boron (CoFeB). In some embodiments, the ferromagnetic pinned layer includes CoFeTa, NiFe, Co, CoFe, CoPt, or the alloy of Ni, Co and Fe. An exemplary formation method of the ferromagnetic pinned layer includes sputtering, PVD, ALD, e-beam or thermal evaporation, or the like. In some embodiments, the ferromagnetic pinned layer includes a multilayer structure.

The tunnel barrier layer is formed over the first magnetic layer. The tunnel barrier layer can also be referred to as a tunneling layer, which is thin enough that electrons are able to tunnel through the tunnel barrier layer when a biasing voltage is applied to a resulting resistance switching element (e.g. a MTJ stack) fabricated from the resistance switching layer 150. In certain embodiments, the tunnel barrier layer includes magnesium oxide (MgO), aluminum oxide ($Al_2O_3$), aluminum nitride (AlN), aluminum oxynitride (AlON), hafnium oxide ($HfO_2$) or zirconium oxide ($ZrO_2$). An exemplary formation method of the tunnel barrier layer includes sputtering, PVD, ALD, e-beam or thermal evaporation, or the like.

The second magnetic layer is formed over the tunnel barrier layer. The second magnetic layer is a ferromagnetic free layer in some embodiments. A direction of a magnetic moment of the second magnetic layer is not pinned because there is no anti-ferromagnetic material in the second magnetic layer. Therefore, the magnetic orientation of this layer is adjustable, thus the layer is referred to as a free layer. In some embodiments, the direction of the magnetic moment of the second magnetic layer is free to rotate parallel or anti-parallel to the pinned direction of the magnetic moment of the ferromagnetic pinned layer in the first magnetic layer. The second magnetic layer may include a ferromagnetic material similar to the material in the ferromagnetic pinned layer in the first magnetic layer. Since the second magnetic layer has no anti-ferromagnetic material while the first magnetic layer has an anti-ferromagnetic material therein, the first and second magnetic layers and have different materials. In certain embodiments, the second magnetic layer includes cobalt, nickel, iron or boron. An exemplary formation method of the second magnetic layer includes sputtering, PVD, ALD, e-beam or thermal evaporation, or the like.

A top electrode layer 160 is formed over the resistance switching layer 150. The top electrode layer 160 includes a conductive material. In some embodiments, the top electrode layer 160 may include a metal, such as tungsten (W), titanium (Ti), tantalum (Ta), platinum (Pt), ruthenium (Ru), aluminum (Al), copper (Cu), the like or combinations thereof. An exemplary formation method of the top electrode layer 160 includes sputtering, PVD, or the like. In some embodiments, prior to the formation of the top electrode layer 160, a capping layer (not shown) is formed over the resistance switching layer 150. The capping layer may be a thin metal layer that protects the resistance switching layer 150 from oxidation during fabrication process. The capping layer may be deposited by PVD, ALD, e-beam or thermal evaporation, or the like.

A metal-containing mask layer 170 is formed over the top electrode layer 160 in sequence. In some embodiments, the metal-containing mask layer 170 is formed from a metal material or a metal-containing compound material. For example, the metal-containing mask layer 170 may include a metal (e.g., Ta), a metal nitride (e.g., titanium nitride (TiN)), the like, and/or combinations thereof. The metal-containing mask layer 170 may be formed by acceptable deposition techniques, such as CVD, ALD, PVD, the like, and/or combinations thereof.

Figure 6:
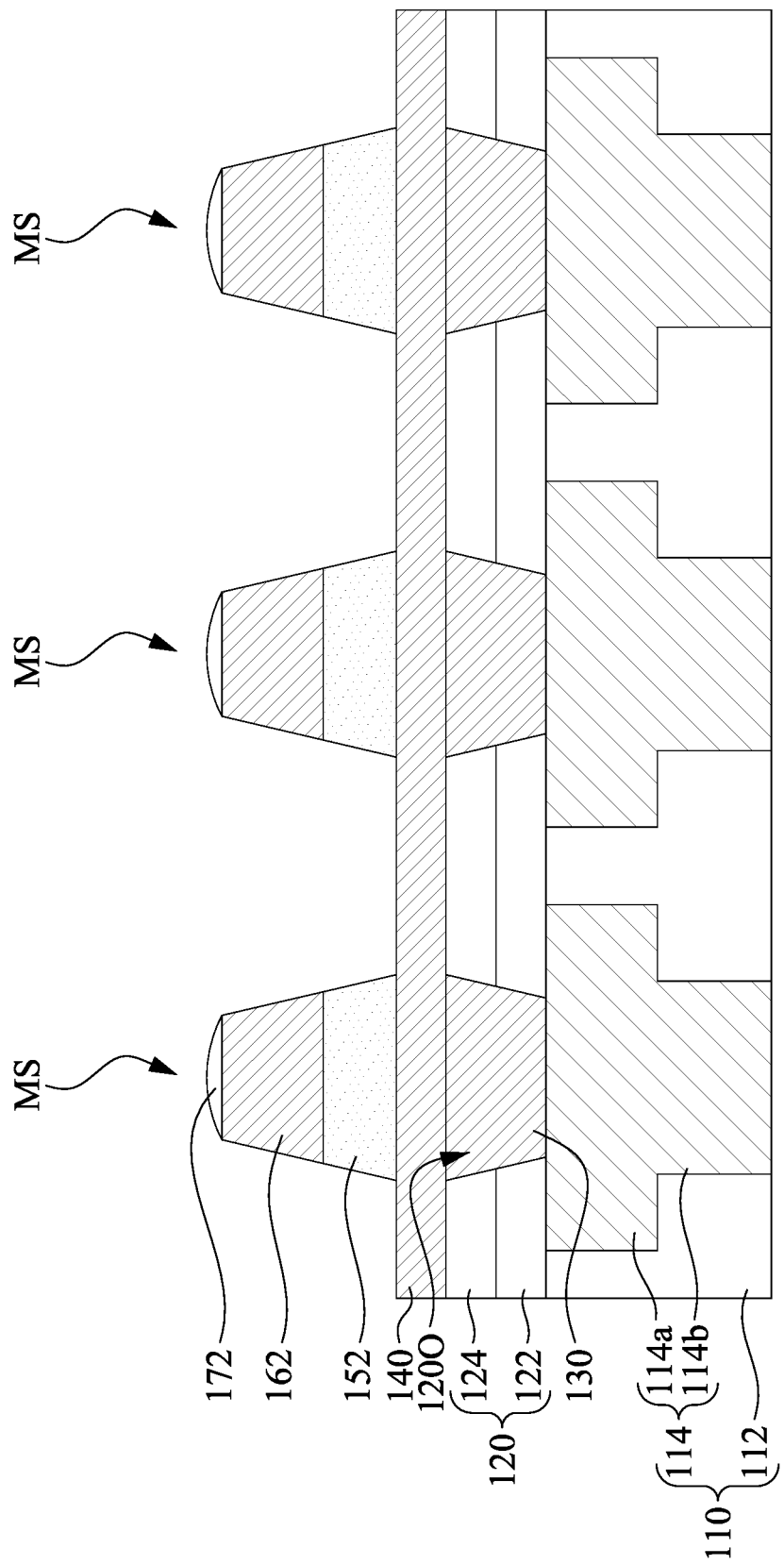

Reference is made to FIG. 6. The metal-containing mask layer 170, the top electrode layer 160, and the resistance switching layer 150 (referring to FIG. 5) are patterned into memory stacks MS. After the patterning process, each of the memory stacks MS may include a resistance switching element 152, a top electrode 162 over the resistance switching element 152, and a metal-containing mask 172 over the top electrode 162.

In some embodiments, a patterned mask (not shown) is formed over the metal-containing mask layer 170 (referring to FIG. 5), and then one or more etching processes are performed to etch the metal-containing mask layer 170, the top electrode layer 160, and the resistance switching layer 150 (referring to FIG. 5) through the patterned mask, thereby achieving the patterning process. The patterned mask may be a photoresist formed by photolithography patterning processes, including photoresist coating (e.g., spin-on coating), soft baking, mask aligning, exposure, post-exposure baking, developing the photoresist, rinsing, drying (e.g., hard baking), and/or other applicable processes. In some embodiments, the patterned mask may include a hard mask below the photoresist for protecting the underlying layers against subsequent etching process. The hard mask may include $Si_3N_4$ and/or silicon oxynitride.

In some embodiments, the metal-containing mask layer 170 and the top electrode layer 160 (referring to FIG. 5) are patterned into the metal-containing masks 172 and the top electrodes 162 by a first etching process through the patterned mask (not shown), and the resistance switching layer 150 is patterned into the resistance switching elements 152 by a second etching process. In some embodiments, the first and second etching processes are dry etching processes using suitable etchants.

In some embodiments, the first etching process may be a dry etch using fluoride-based etchants, such as $CF_4$. For example, the dry etch may etch and remove portions of the metal-containing mask layer 170 and the top electrode layer 160 (referring to FIG. 5) exposed by the patterned mask (not shown), while other portions of the metal-containing mask layer 170 and the top electrode layer 160 (referring to FIG. 5) covered by the patterned mask (not shown) are protected from being etched during the dry etch.

In some embodiments, the second etching process may be a dry etch that employs pure chemical etching process (e.g., plasma etching) or dry etching techniques that employs both physical and chemical etching techniques (e.g., RIE). Gases, such as $CH_3OH$, $CO$, $NH_3$ may be used during the second etching process. The metal-containing masks 172 and the top electrodes 162 may have a higher etch resistance to the second etching process than that of the resistance switching layer 150 (referring to FIG. 5), such that the metal-containing masks 172 and the top electrodes 162 may serve as a etch mask during the second etching process. In some embodiments, the bottom electrode layer 140 has a higher etch resistance to the second etching process than that of the resistance switching layer 150 (referring to FIG. 5), such that the bottom electrode layer 140 remain substantially intact after the second etching process. For example, the bottom electrode layer 140 remains covering the dielectric layer 120.

Figure 7:
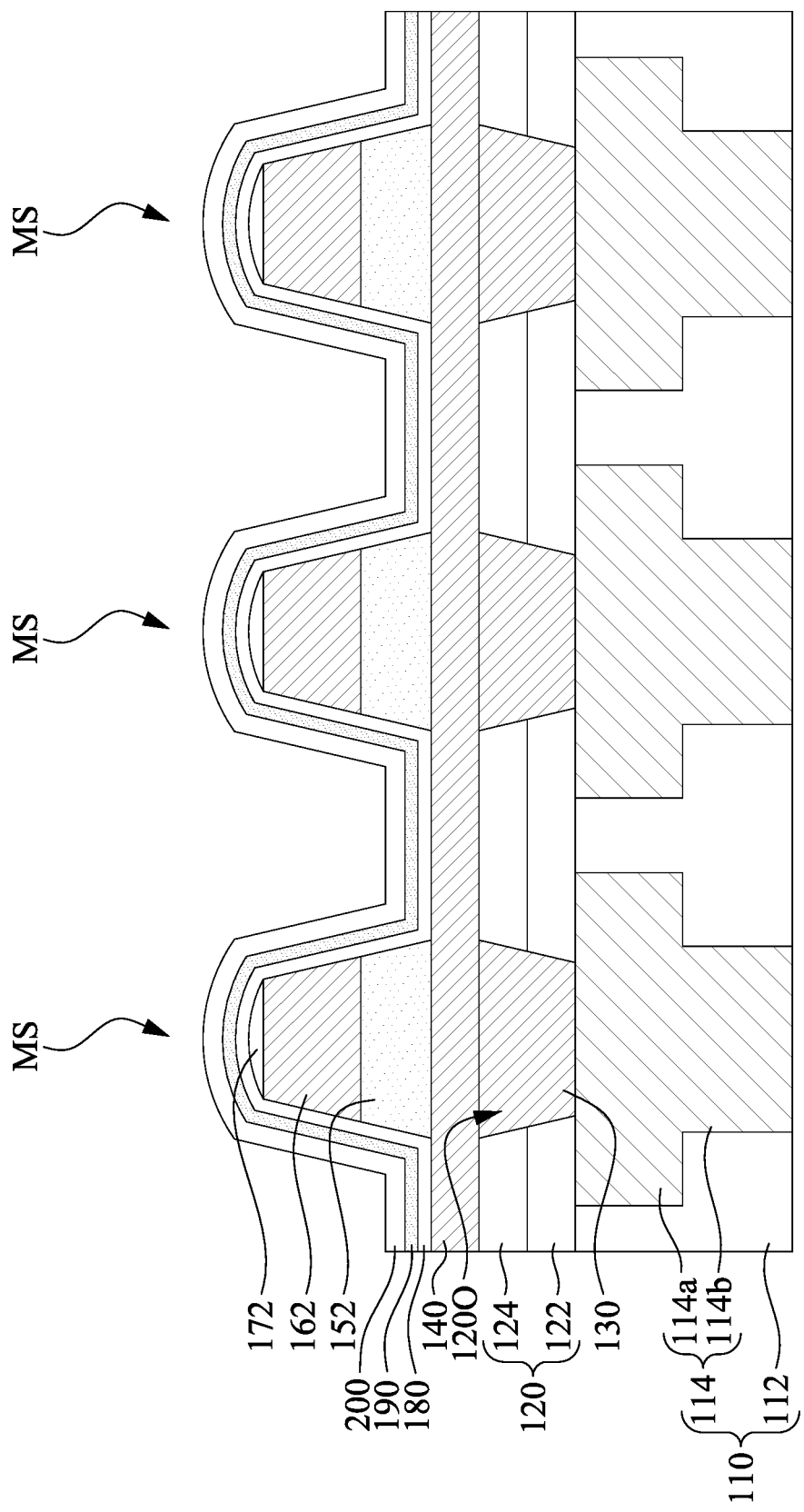

Reference is made to FIG. 7. A first spacer layer 180, a magnetic shielding layer 190, and a second spacer layer 200 are conformally deposited over the structure of FIG. 6 in a sequence.

The first spacer layer 180 may be made of non-magnetic material. The first spacer layer 180, in some embodiments may include SiN, but in other embodiments may include SiC, SiON, silicon oxycarbide (SiOC), the like, and/or combinations thereof. The first spacer layer 180 may be formed using CVD, PVD, ALD, the like, and/or combinations thereof.

The magnetic shielding layer 190 may be metal or insulator with magnetic properties, such as high permeability/susceptibility, soft ferromagnetic, low magnetic anisotropy/magnetostriction, and/or low or no hysteresis loop. The magnetic shielding layer 190 may include soft-magnetic materials. For example, the magnetic shielding layer 190 may include Co, Fe, Ni, the like, the alloy thereof and/or combinations thereof, and the magnetic shielding layer 190 can be doped with copper, silicon, carbon, or molybdenum (Mo). For example, the magnetic shielding layer 190 may include a Mu-metal, which is an alloy of Nickel-Iron (NiFe) doped with copper, silicon, or molybdenum. In some embodiments wherein the magnetic shielding layer 190 is made of $Ni_xFe_{(100-x)}$, x is in a range from about 50 to about 100. In some embodiments wherein the magnetic shielding layer 190 is made of $Co_xNi_{(100-x)}$, x is in a range from about 50 to about 100. In some embodiments wherein the magnetic shielding layer 190 is made of $Co_xFe_{(100-x)}$, x is in a range from about 50 to about 100. If x is less than about 50, the magnetic shielding layer 190 may have a low ability to effectively shield memory cells from magnetic field, such that a thickness of the magnetic shielding layer 190 is required to be increased, which may increase the difficulty of fabrication process. The magnetic shielding layer 190 may be formed using CVD, PVD, ALD, the like, and/or combinations thereof. In some embodiments, the magnetic shielding layer 190 may be conductive.

The second spacer layer 200 may be made of non-magnetic material. The second spacer layer 200, in some embodiments may include SiN, but in other embodiments may include SiC, SiON, silicon oxycarbide (SiOC), the like, and/or combinations thereof. The second spacer layer 200 may be formed using CVD, PVD, ALD, the like, and/or combinations thereof.

Figure 8:
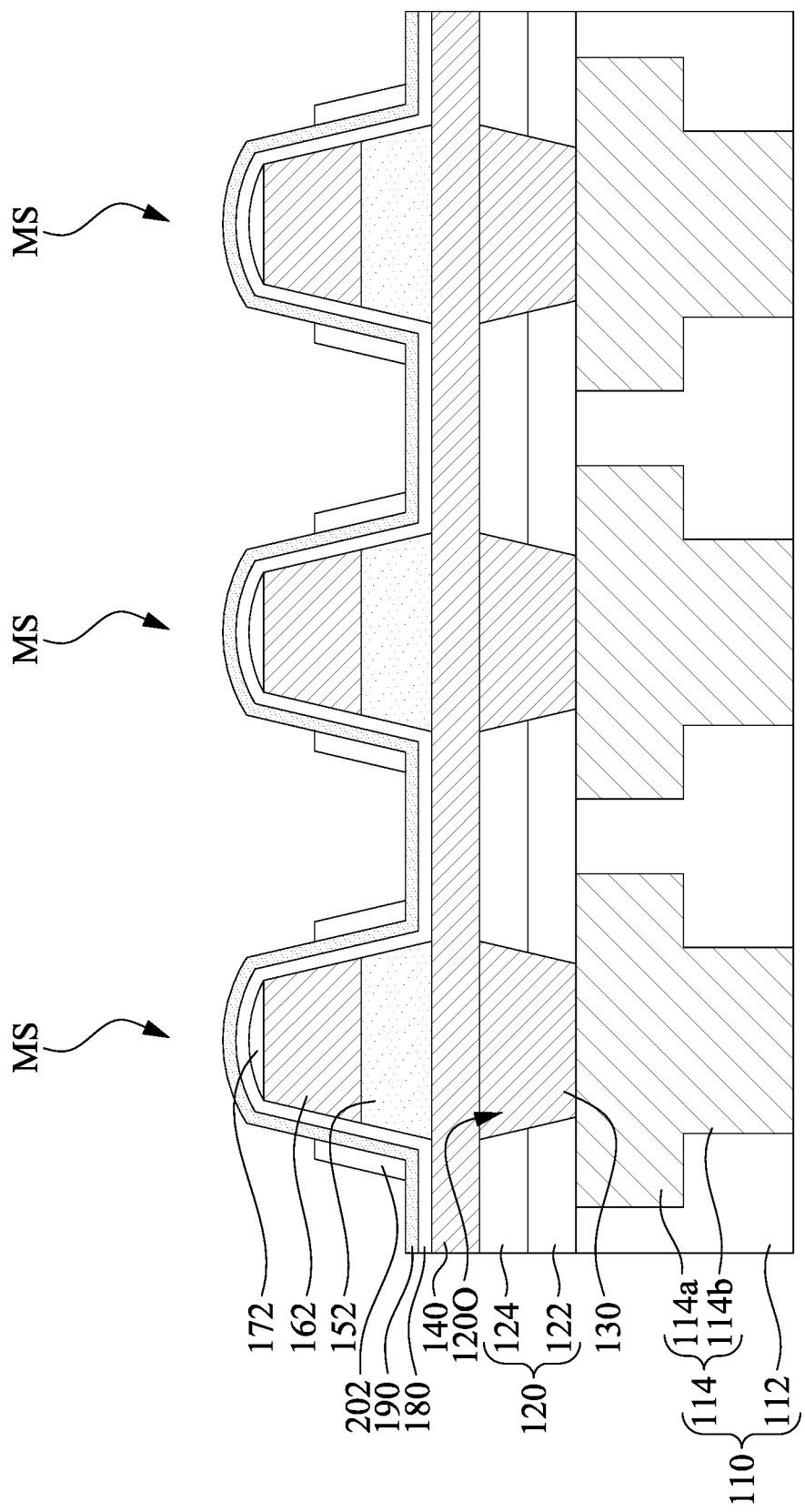

Reference is made to FIG. 8. The second spacer layer 200 may be patterned into second spacers 202 by a suitable etching process. The etching process may be anisotropic dry etching process, using gas etchants such as $CH_2F_2$, $CF_4$, $CH_xF_y$, $CHF_3$, $CH_4$, $N_2$, $O_2$, Ar, He, or the like. The etching process removes horizontal portions of the second spacer layer 200 (referring to FIG. 7), and leaving vertical portions of the second spacer layer 200 (referring to FIG. 7) on sidewalls of the memory stacks MS. The remaining vertical portions of the second spacer layer 200 (referring to FIG. 7) may be referred to as the second spacers 202 hereinafter. In some embodiments, the second spacers 202 respectively enclose the memory stacks MS. The second spacers 202 may include multiple layers in some embodiments. In some embodiments, the magnetic shielding layer 190 may have a higher etch resistance to the etching process than that of the second spacers 202, such that the etching process to the second spacer layer 200 (referring to FIG. 7) may stop at the top surface of the magnetic shielding layer 190. After the etching process, portions of the magnetic shielding layer 190 are exposed by the second spacers 202.

Figure 9:
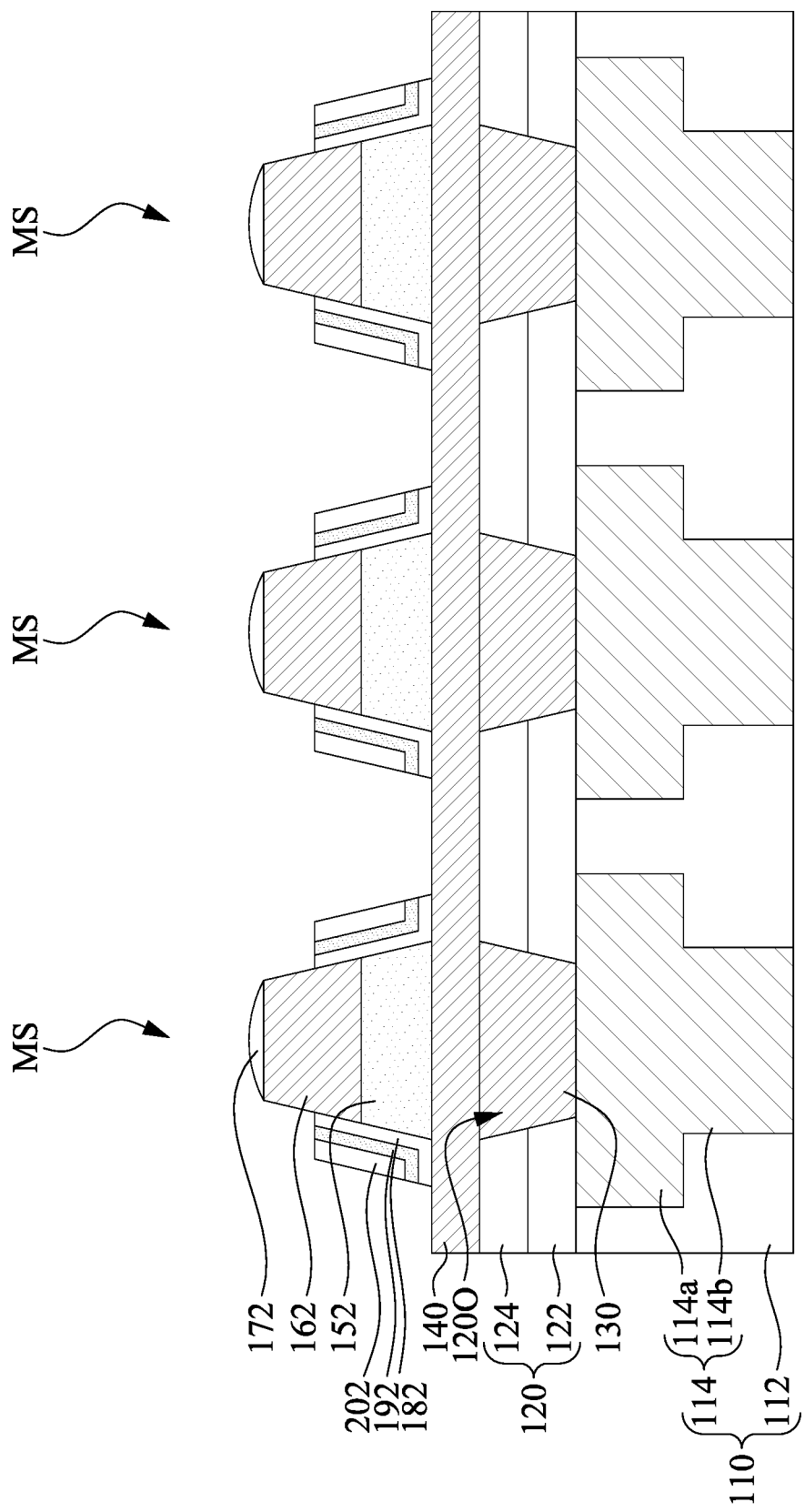

Reference is made to FIG. 9. The magnetic shielding layer 190 and the first spacer layer 180 (referring to FIG. 8) are patterned into magnetic shielding element 192 and first spacers 182. The patterning process may include a first etching process to the magnetic shielding layer 190 (referring to FIG. 8) and a second etching process to the first spacer layer 180 (referring to FIG. 8).

The first etching process is performed to remove horizontal portions of the magnetic shielding layer 190 (referring to FIG. 8) exposed by the second spacers 202. The first etching process may be anisotropic dry etching process, using gas etchants capable of etching metals (e.g., Co). For example, the first etching process may use chlorine-based gas. The second spacers 202 may have a higher etch resistance to the first etching process than that of the magnetic shielding layer 190 (referring to FIG. 8), thereby may serve as an etch mask that protecting portions of the magnetic shielding layer 190 from being etched. The first spacer layer 180 (referring to FIG. 8) may also have a higher etch resistance to the first etching process than that of the magnetic shielding layer 190 (referring to FIG. 8), such that the first etching process may stop when the first spacer layer 180 (referring to FIG. 8) is exposed. The remaining portions of the magnetic shielding layer 190 (referring to FIG. 8) may be referred to as the magnetic shielding elements 192 hereinafter. In some embodiments, the magnetic shielding elements 192 respectively enclose the memory stacks MS. The magnetic shielding elements 192 may include multiple layers in some embodiments.

The second etching process may be anisotropic dry etching process, using gas etchants different from that of first etching process. For example, the second etching process may use fluorine-based gas, such as such as $CH_2F_2$, $CF_4$, $CH_xF_y$, $CHF_3$, or the like. The second etching process removes horizontal portions of the first spacer layer 180 (referring to FIG. 8), and leaving second spacers 202 and vertical portions of the first spacer layer 180 (referring to FIG. 8) on sidewalls of the memory stacks MS. The remaining vertical portions of the first spacer layer 180 (referring to FIG. 8) may be referred to as the first spacers 182 hereinafter. In some embodiments, the first spacers 182 respectively enclose the memory stacks MS. The first spacers 182 may include multiple layers in some embodiments. In some embodiments, the bottom electrode layer 140 and the metal-containing masks 172 may have a higher etch resistance to the second etching process than that of the first spacers 182, such that the second etching process to the first spacer layer 180 (referring to FIG. 8) may stop at the top surface of the bottom electrode layer 140 and the metal-containing masks 172. After the etching process, top surfaces of the metal-containing masks 172 and portions of the bottom electrode layer 140 are exposed by the first spacers 182.

Figure 10:
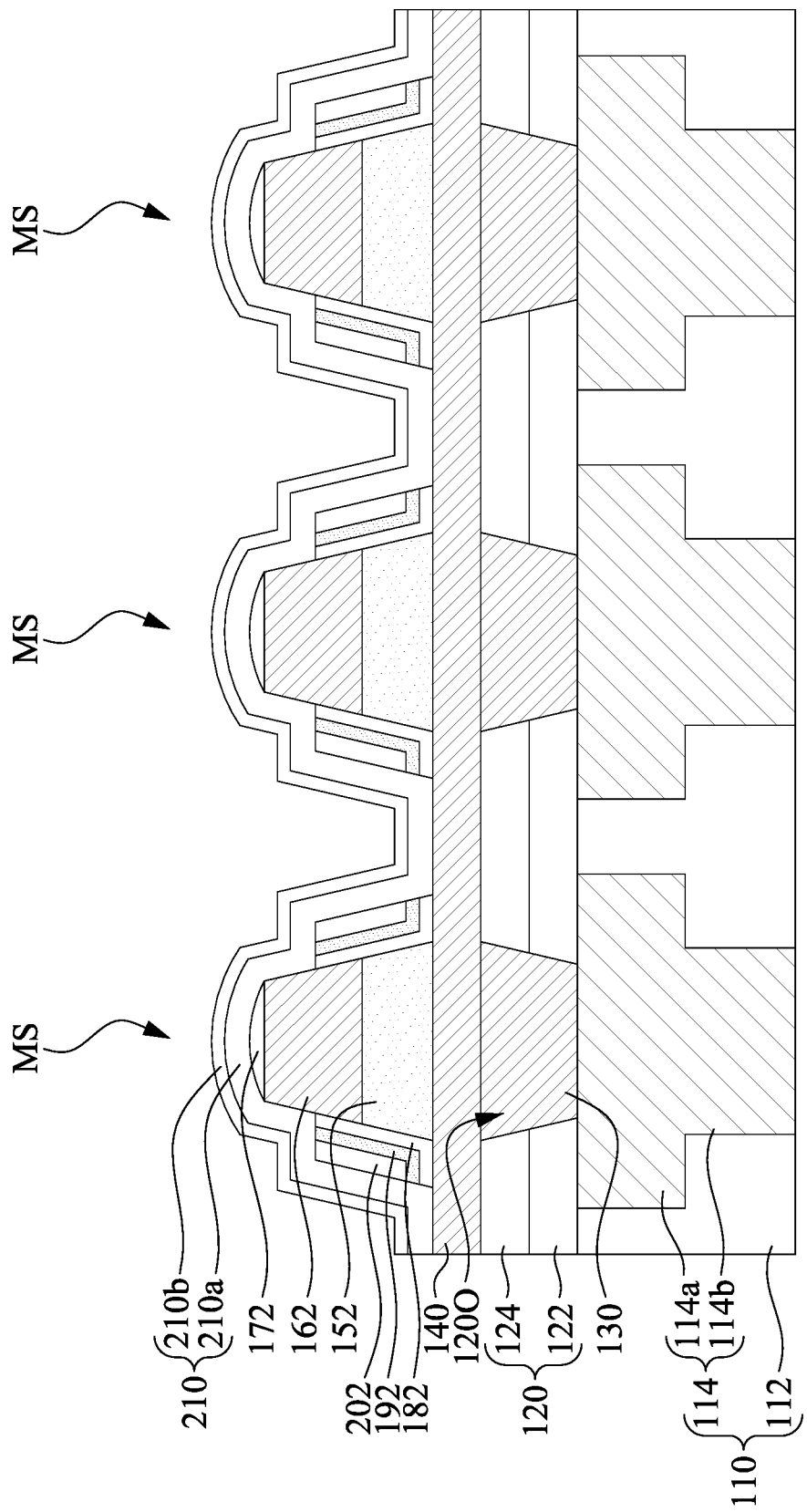

Reference is made to FIG. 10. A third spacer layer 210 is deposited over the structure of FIG. 9. The third spacer layer 210 may be made of non-magnetic material. The third spacer layer 210, in some embodiments may include SiN, but in other embodiments may include SiC, SiON, silicon oxycarbide (SiOC), the like, and/or combinations thereof. For example, herein, the third spacer layer 210 may include a silicon nitride layer 210a and a silicon oxide layer 210b over the silicon nitride layer 210a. The third spacer layer 210 may be formed using CVD, PVD, ALD, the like, and/or combinations thereof.

Figure 11:
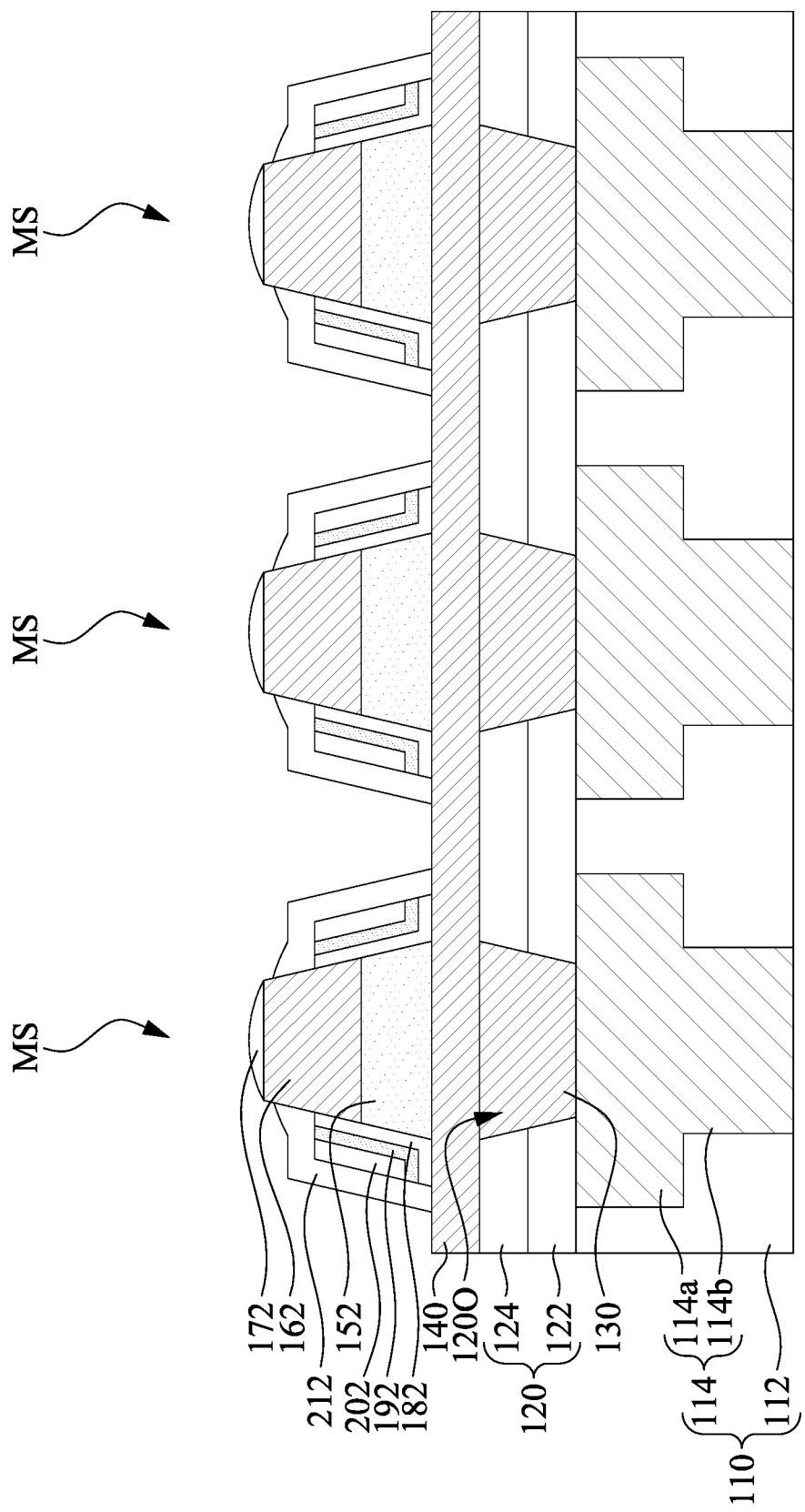

Reference is made to FIG. 11. The third spacer layer 210 may be patterned into third spacers 212 by a suitable etching process. The etching process may be anisotropic dry etching process, using gas etchants such as $CH_2F_2$, $CF_4$, $CH_xF_y$, $CHF_3$, $CH_4$, $N_2$, $O_2$, Ar, He, or the like. The etching process removes horizontal portions of the third spacer layer 210 (referring to FIG. 10), and leaving vertical portions of the third spacer layer 210 (referring to FIG. 10) on sidewalls of the memory stacks MS. The remaining vertical portions of the third spacer layer 210 (referring to FIG. 10) may be referred to as the third spacer 212 hereinafter. In some embodiments, the third spacer 212 respectively enclose the memory stacks MS. The third spacer 212 may include multiple layers in some embodiments. In some embodiments, the bottom electrode layer 140 and the metal-containing masks 172 may have a higher etch resistance to the etching process than that of the third spacer 212, such that the etching process to the third spacer layer 210 (referring to FIG. 10) may stop at top surface of the bottom electrode layer 140 and the metal-containing masks 172. In some embodiments, a top of the third spacer 212 is higher than tops of the first spacers 182, the magnetic shielding elements 192, and the second spacers 202. The silicon oxide layer 210b may be consumed by the etching process. After the etching process, portions of the bottom electrode layer 140 are exposed by the third spacer 212.

Figure 12:
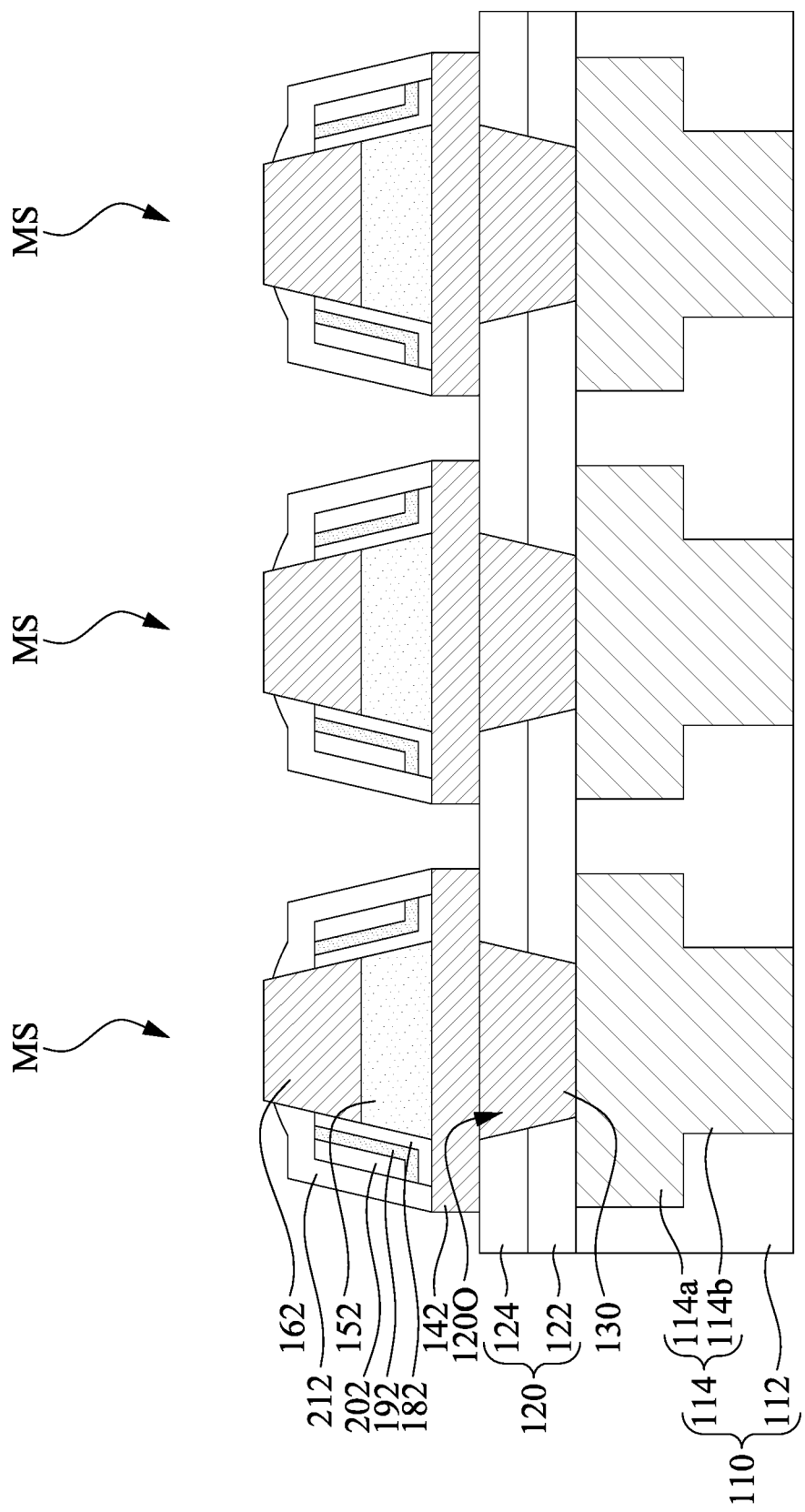

Reference is made to FIG. 12. The bottom electrode layer 140 (referring to FIG. 11) is patterned into bottom electrodes 142 by suitable etching process. The bottom electrodes 142 are in contact with the BEVAs 130. The bottom electrode layer 140 (referring to FIG. 11) can be patterned using the third spacer 212 as an etch mask, and hence the bottom electrode layer 140 (referring to FIG. 11) can be patterned in a self-aligned manner. In some embodiments, the patterning process may include one or more etching operations, such as dry etching, wet etching or a combination thereof. In some embodiments, the patterning process may include a dry etching using chlorine based, fluorine based, or oxygen containing gaseous etchant such as CO, $O_2$, $CO_2$, $CF_4$, $CH_2F_2$, $C_4F_8$, $NF_3$, $SF_6$, $Cl_2$, $BCl_3$ and/or other chemicals, as example. In some embodiments, the third spacers 212 have a higher etch resistance to the etching process than that of the bottom electrodes 142, such that the resistance switching element 152 may be protected from being etched during the patterning the bottom electrode layer 140 (referring to FIG. 11). In some embodiments, the metal-containing masks 172 may be consumed by the etching process. In some embodiments, a combination of the bottom electrodes 142 and the memory stacks MS may be referred to as a memory cell MC, such as MRAM cell.

Figure 13:
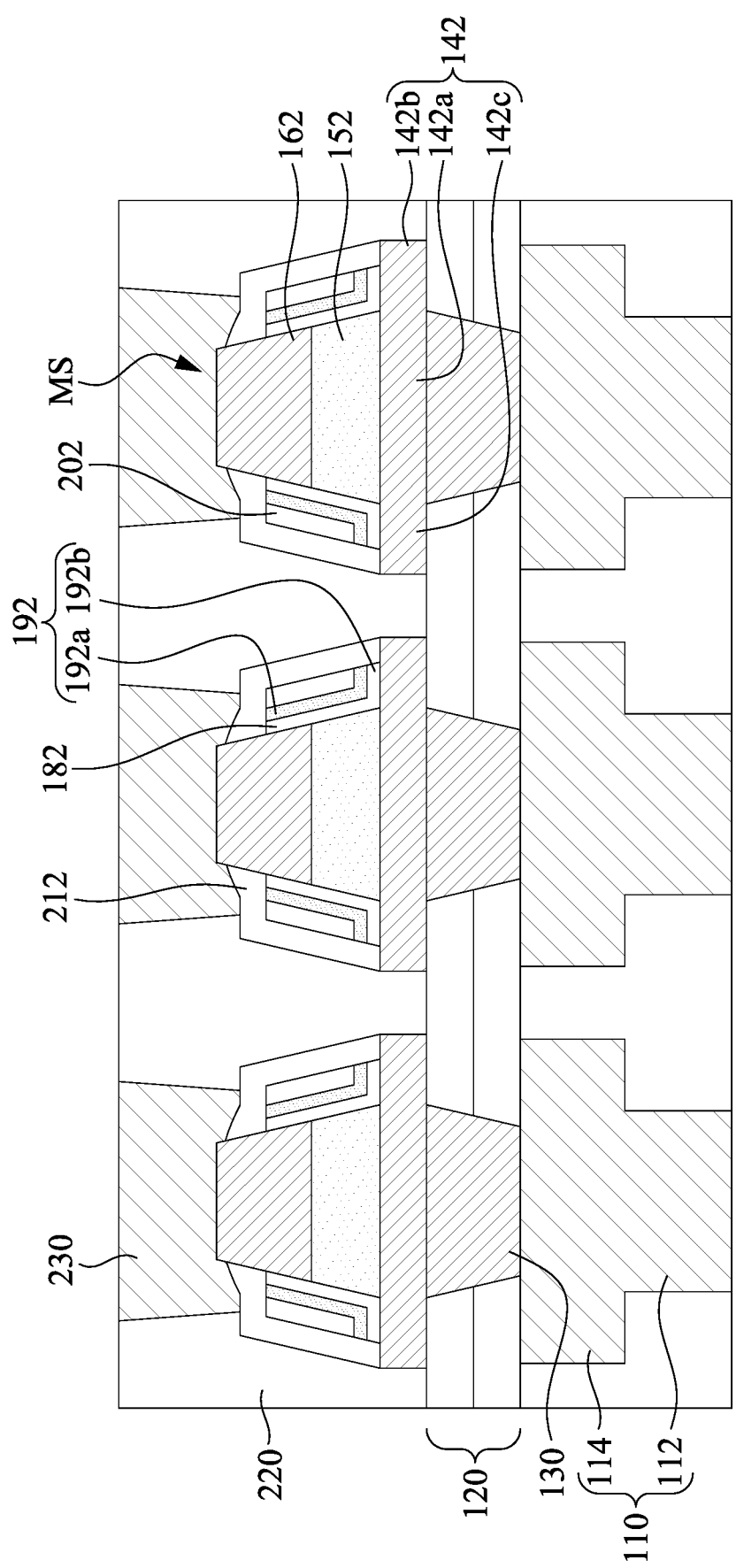

Reference is made to FIG. 13. An ILD layer 220 is formed over the structure of FIG. 12. In some embodiments, the ILD layer 220 includes silicon oxide, fluorinated silica glass (FSG), carbon doped silicon oxide, tetra-ethyl-ortho-silicate (TEOS) oxide, phosphosilicate glass (PSG), borophosphosilicate glass (BPSG), Black Diamond® (Applied Materials of Santa Clara, Calif.), amorphous fluorinated carbon, low-k dielectric material, the like or combinations thereof. The material of ILD layer 220 may be the same as or different from the ILD layer 112.

A metallization pattern 230 is then formed in the ILD layer 220. In the present embodiments, the metallization pattern 230 include conductive lines connected to the top electrodes 162, and does not include a conductive via intervened between conductive lines and the top electrodes 162. In some other embodiments, the metallization pattern 230 may include conductive vias, conductive lines, or the combination thereof. Formation of the metallization pattern 230 may be formed by etching openings and/or trenches in the ILD layer 220, and then filling one or more metals (e.g., copper) in the openings and/or trenches to form the metallization pattern 260. In some embodiments where the ILD layer 220 is silicon oxide, the etchant used in etching the openings and/or trenches can be dilute hydrofluoric acid (HF), HF vapor, $CF_4$, $C_4F_8$, $CH_xF_y$, $C_xF_y$, $SF_6$, or $NF_3$, Ar, $N_2$, $O_2$, Ne, gas. In some embodiments, the top electrodes 162 may has a higher etch resistance to the etching the openings and trenches than that of the ILD layer 220, such that the etching the openings may stop at the top electrodes 162 and not damage the underlying layers. After the openings and trenches are filled with metals, a planarization is performed to remove an excess portion of the metals outside the openings, and therefore the metallization pattern 230 is formed.

Through the processes, the magnetic shielding elements 192 and the first to third spacers 182, 202, 212 are formed around the memory cell MC, in which the magnetic shielding elements 192 may be located between the first and second spacers 182 and 202. In present embodiments, the first spacers 182 spaces the magnetic shielding elements 192 apart from the top electrodes 162, the resistance switching element 152, and the bottom electrode layer 142. In present embodiments, the second spacers 202 serve as etch masks during patterning the magnetic shielding layer 190 (referring to FIGS. 8-9). In present embodiments, the third spacers 212 serve as etch masks during patterning the bottom electrode layer 140 (referring to FIGS. 11-12) and space the magnetic shielding elements 192 apart from the metallization pattern 230. The third spacers 212 may be over a top surface of the bottom electrode 142. In present embodiments, tops of the magnetic shielding elements 192 are lower than top surfaces of the top electrodes 162, and higher than top surfaces of the resistance switching element 152. In present embodiments, bottoms of the magnetic shielding elements 192 are higher than top surfaces of the bottom electrodes 142.

In some embodiments, the top electrode 162 and the resistance switching element 152 are over a portion 142a of the bottom electrode 142, the magnetic shielding element 192 is over a portion 142c of the bottom electrode 142. The magnetic shielding element 192 may have a portion 192a extending along a sidewall of the resistance switching element 152 and a portion 192b extending along a top surface of the second portion 142c of the bottom electrode 142. The first spacer 182 may space the portion 192b of the magnetic shielding element 192 apart from the top surface of the portion 142c of the bottom electrode 142, and space the portion 192a of the magnetic shielding element 192 apart from the sidewall of the resistance switching element 152. The second spacer 202 may be over the portion 192b of the magnetic shielding element 192, and a top of the magnetic shielding element 192 is free of coverage of the second spacer 202. The third spacer 212 may be over a portion 142b of the bottom electrode 142, the third spacer 212 may cover the top of the magnetic shielding element 192, and the portion 142c of the bottom electrode 142 is between the portions 142a and 142b of the bottom electrode 142.

Through the configuration, the magnetic shielding elements 192 is free of being contacting with the bottom electrodes 142, the top electrodes 162, and the metallization pattern 230. Therefore, the magnetic shielding elements 192 are preventing from establishing an electrical connection between the bottom electrodes 142 and the top electrodes 162 or an electrical connection between the bottom electrodes 142 and the metallization pattern 230.

FIGS. 14 through 21 are cross-sectional views of an integrated circuit device in various stages of fabrication in accordance with some embodiments of the present disclosure. The illustration is merely exemplary and is not intended to limit beyond what is specifically recited in the claims that follow. It is understood that additional operations may be provided before, during, and after the operations shown by FIGS. 2-14, and some of the operations described below can be replaced or eliminated for additional embodiments of the method. The order of the operations/processes may be interchangeable.

Figure 14:
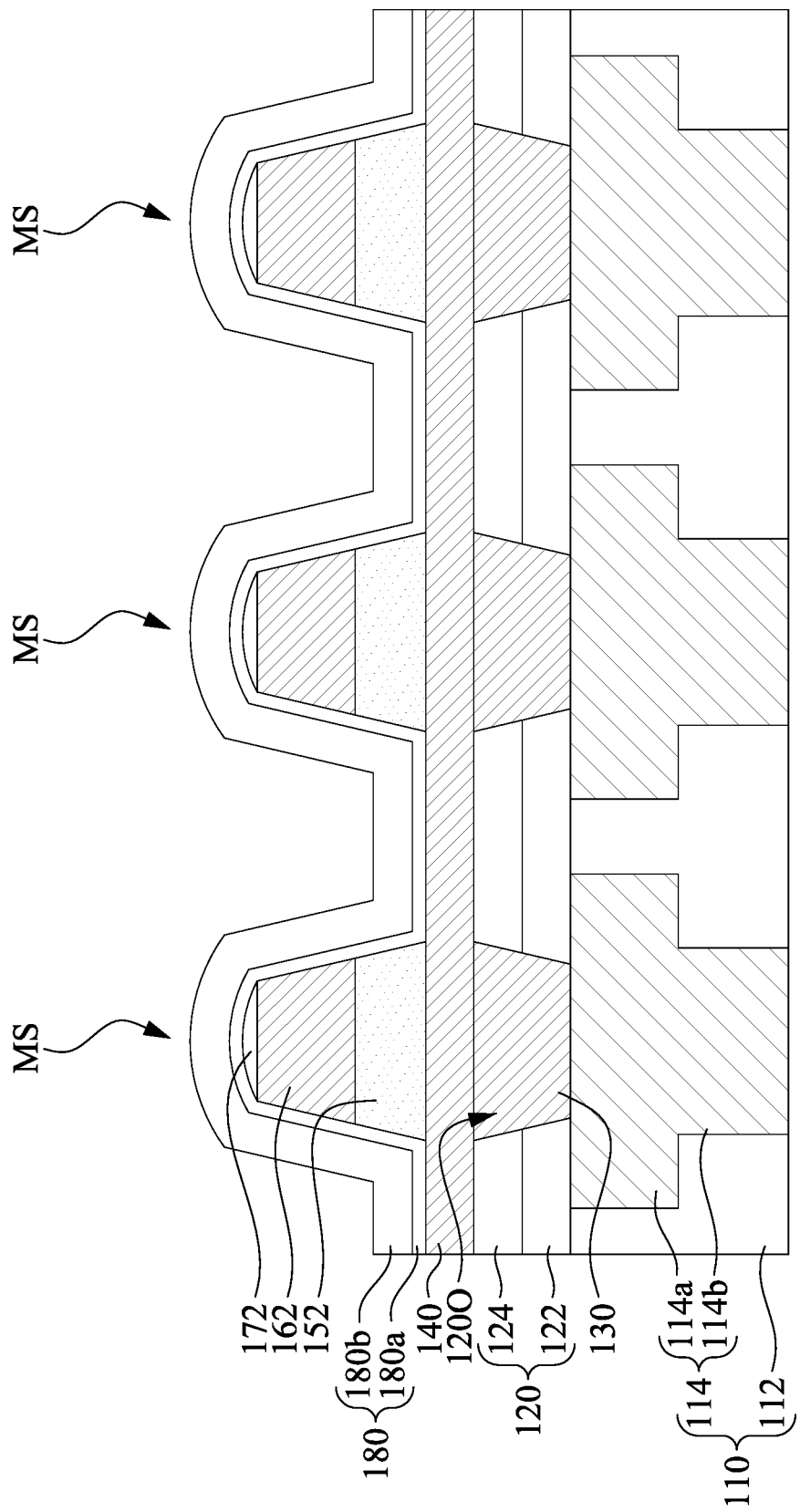
FIGS. 14 through 21 are cross-sectional views of an integrated circuit device in various stages of fabrication in accordance with some embodiments of the present disclosure.

FIG. 14 shows a first spacer layer 180 is deposited over the structure of FIG. 6 in a sequence. The first spacer layer 180 may be made of non-magnetic material. The first spacer layer 180, in some embodiments may include SiN, but in other embodiments may include SIC, SiON, silicon oxycarbide (SiOC), the like, and/or combinations thereof. The first spacer layer 180 may be formed using CVD, PVD, ALD, the like, and/or combinations thereof. The first spacer layer 180 include a in-situ spacer layer 180a and an ex-situ spacer layer 180b, in which the in-situ spacer layer 180a is formed just after the formation of the memory stack MS, for example, with the chamber that patterning the resistance switching layer 150 (referring to FIG. 5) during the formation of the memory stack MS.

Figure 15:
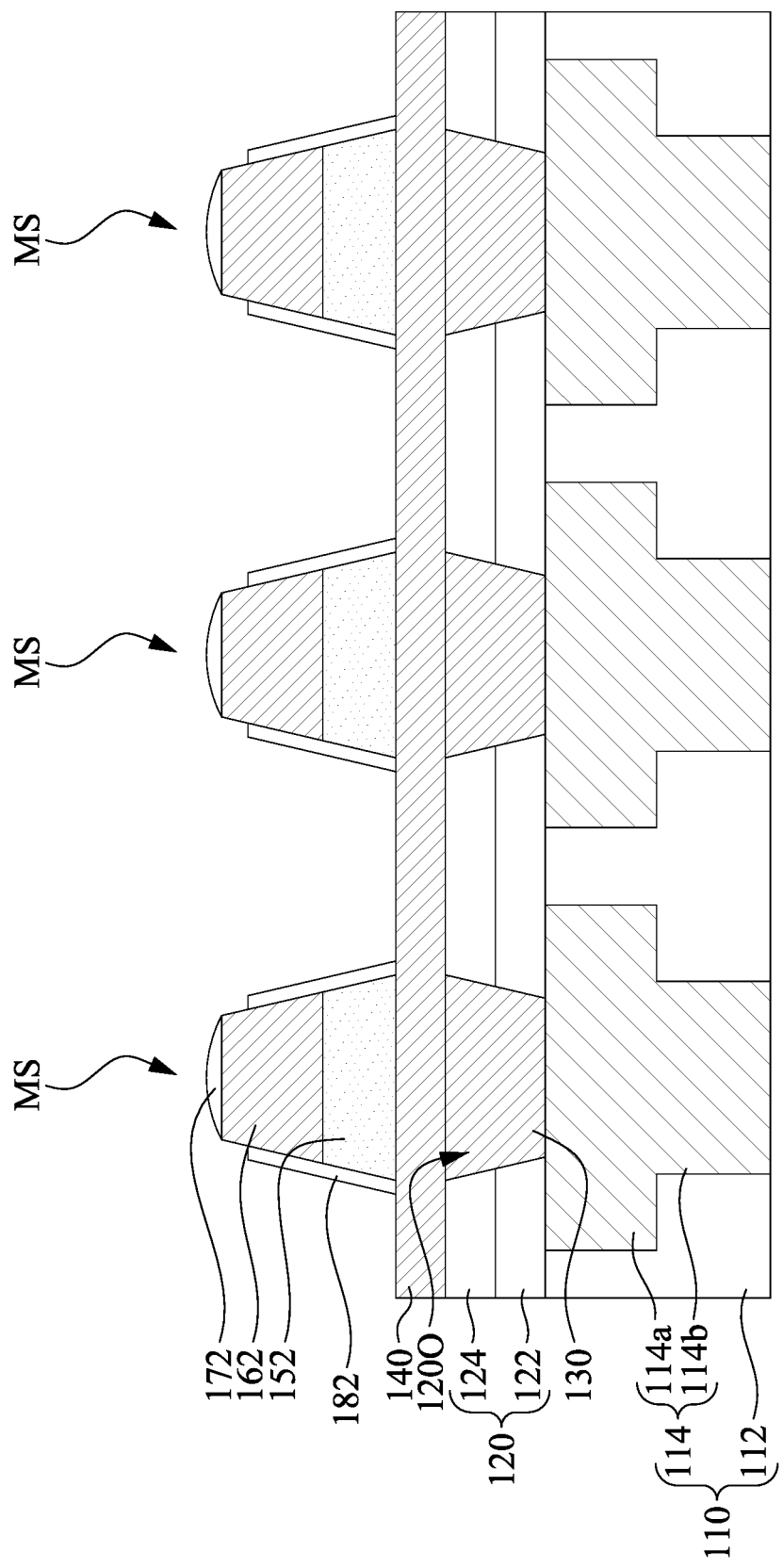

Reference is made to FIG. 15. The first spacer layer 180 may be patterned into e first spacers 182 by a suitable etching process. The etching process may be anisotropic dry etching process, using gas etchants such as $CH_2F_2$, $CF_4$, $CH_xF_y$, $CHF_3$, $CH_4$, $N_2$, $O_2$, Ar, He, or the like. The etching process removes horizontal portions of the first spacer layer 180 (referring to FIG. 14), and leaving vertical portions of the first spacer layer 180 (referring to FIG. 14) on sidewalls of the memory stacks MS. The remaining vertical portions of the first spacer layer 180 (referring to FIG. 14) may be referred to as the first spacers 182 hereinafter. In some embodiments, the first spacers 182 respectively enclose the memory stacks MS. The first spacers 182 may include multiple layers in some embodiments. In some embodiments, the bottom electrode layer 140 and the metal-containing masks 172 may have a higher etch resistance to the second etching process than that of the first spacers 182, such that the etching process to the first spacer layer 180 (referring to FIG. 14) may stop at the top surface of the bottom electrode layer 140 and the metal-containing masks 172. After the etching process, portions of the bottom electrode layer 140 are exposed by the first spacers 182.

Figure 16:
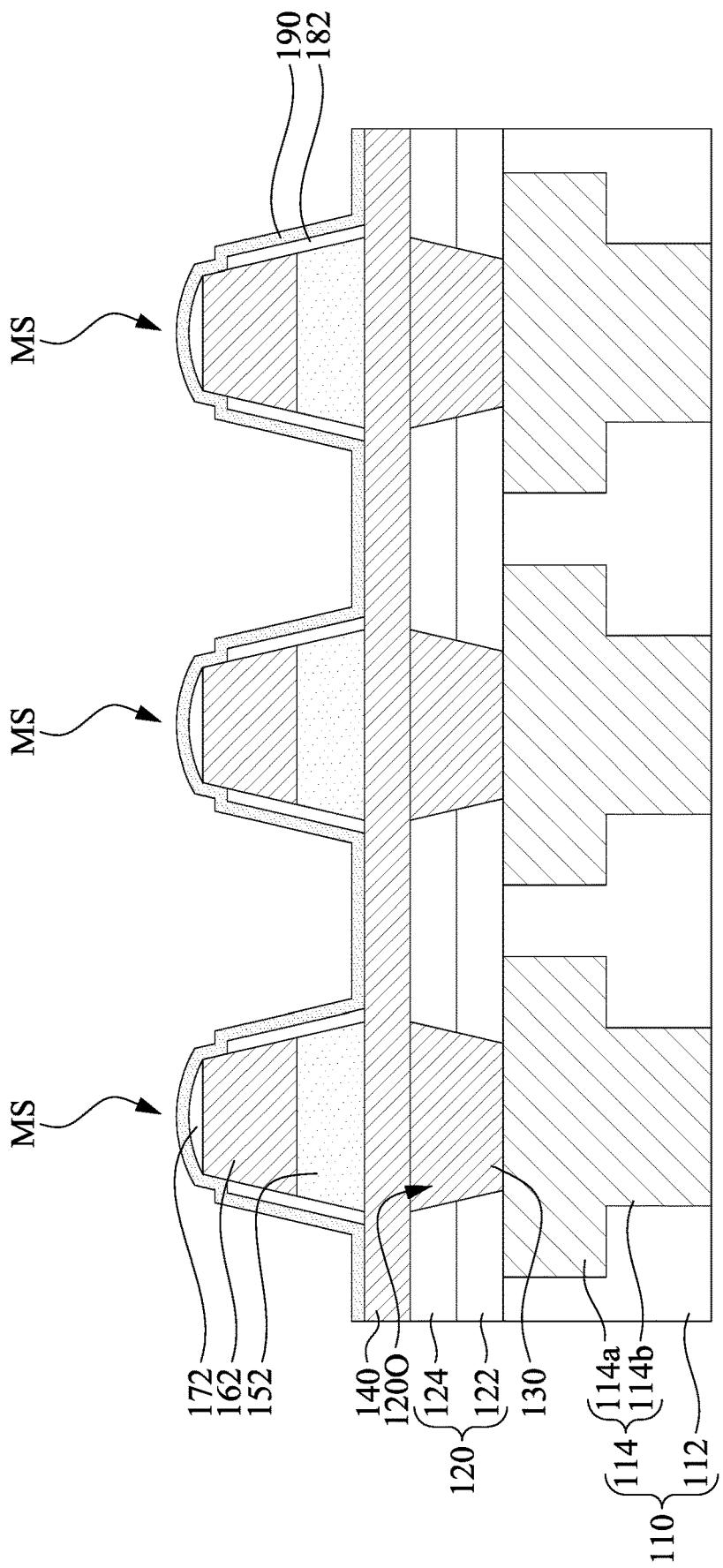

Reference is made to FIG. 16. A magnetic shielding layer 190 is deposited over the structure of FIG. 15. The magnetic shielding layer 190 may include Co, Fe, Ni, the like, the alloy thereof and/or combinations thereof, and the magnetic shielding layer 190 can be doped with copper, silicon, carbon, or molybdenum (Mo). For example, the magnetic shielding layer 190 may include a Mu-metal, which is an alloy of Nickel-Iron (NiFe) doped with copper, silicon, or molybdenum. In some embodiments wherein the magnetic shielding layer 190 is made of $Ni_xFe_{(100-x)}$, x is in a range from about 50 to about 100. In some embodiments wherein the magnetic shielding layer 190 is made of $Co_xNi_{(100-x)}$, x is in a range from about 50 to about 100. In some embodiments wherein the magnetic shielding layer 190 is made of $Co_xFe_{(100-x)}$, x is in a range from about 50 to about 100. If x is less than about 50, the magnetic shielding layer 190 may have a low ability to effectively shield magnetic field, such that a thickness of the magnetic shielding layer 190 is required to be increased, which may increase the difficulty of fabrication process. The magnetic shielding layer 190 may be formed using CVD, PVD, ALD, the like, and/or combinations thereof.

Figure 17:
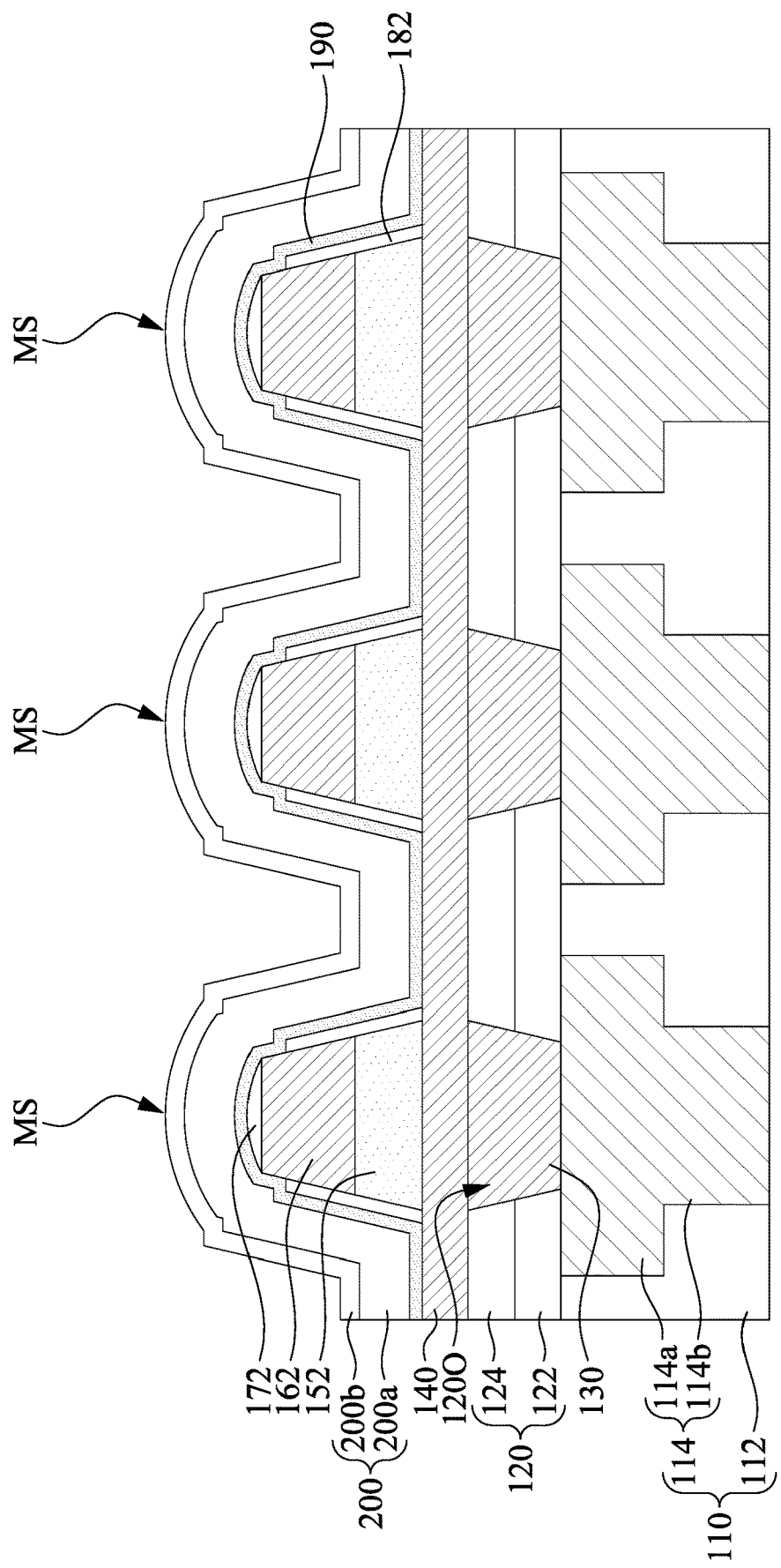

Reference is made to FIG. 17. A second spacer layer 200 is deposited over the structure of FIG. 16. The second spacer layer 200 may be made of non-magnetic material. The second spacer layer 200, in some embodiments may include SiN, but in other embodiments may include SiC, SiON, silicon oxycarbide (SiOC), the like, and/or combinations thereof. For example, herein, the second spacer layer 200 may include a silicon nitride layer 200a and a silicon oxide layer 200b over the silicon nitride layer 200a. The second spacer layer 200 may be formed using CVD, PVD, ALD, the like, and/or combinations thereof.

Figure 18:
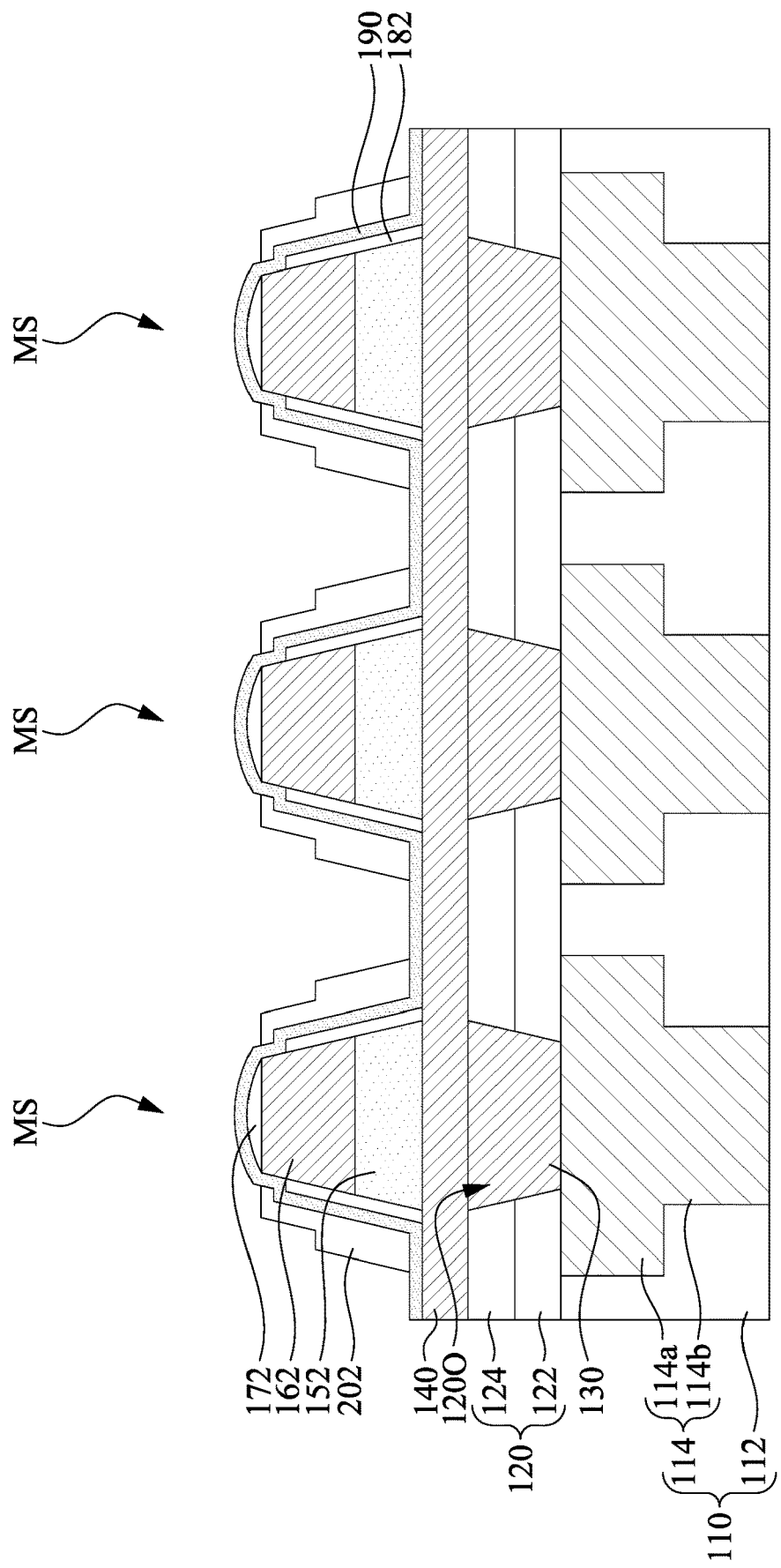

Reference is made to FIG. 18. The second spacer layer 200 may be patterned into second spacers 202 by a suitable etching process. The etching process may be anisotropic dry etching process, using gas etchants such as $CH_2F_2$, $CF_4$, $CH_xF_y$, $CHF_3$, $CH_4$, $N_2$, $O_2$, Ar, He, or the like. The etching process removes horizontal portions of the second spacer layer 200 (referring to FIG. 17), and leaving vertical portions of the second spacer layer 200 (referring to FIG. 17) on sidewalls of the memory stacks MS. The remaining vertical portions of the second spacer layer 200 (referring to FIG. 17) may be referred to as the second spacers 202 hereinafter. In some embodiments, the second spacers 202 respectively enclose the memory stacks MS. In some embodiments, the silicon oxide layer 200b in FIG. 17 may be fully consumed during the etching process, such that the second spacers 202 are formed from the silicon nitride layer 200a. The second spacers 202 may include multiple layers in some embodiments. In some embodiments, the magnetic shielding layer 190 may have a higher etch resistance to the etching process than that of the second spacers 202, such that the etching process to the second spacer layer 200 (referring to FIG. 17) may stop at the top surface of the magnetic shielding layer 190. The silicon oxide layer 200b may be consumed by the etching process. After the etching process, portions of the magnetic shielding layer 190 are exposed by the second spacers 202.

Figure 19:
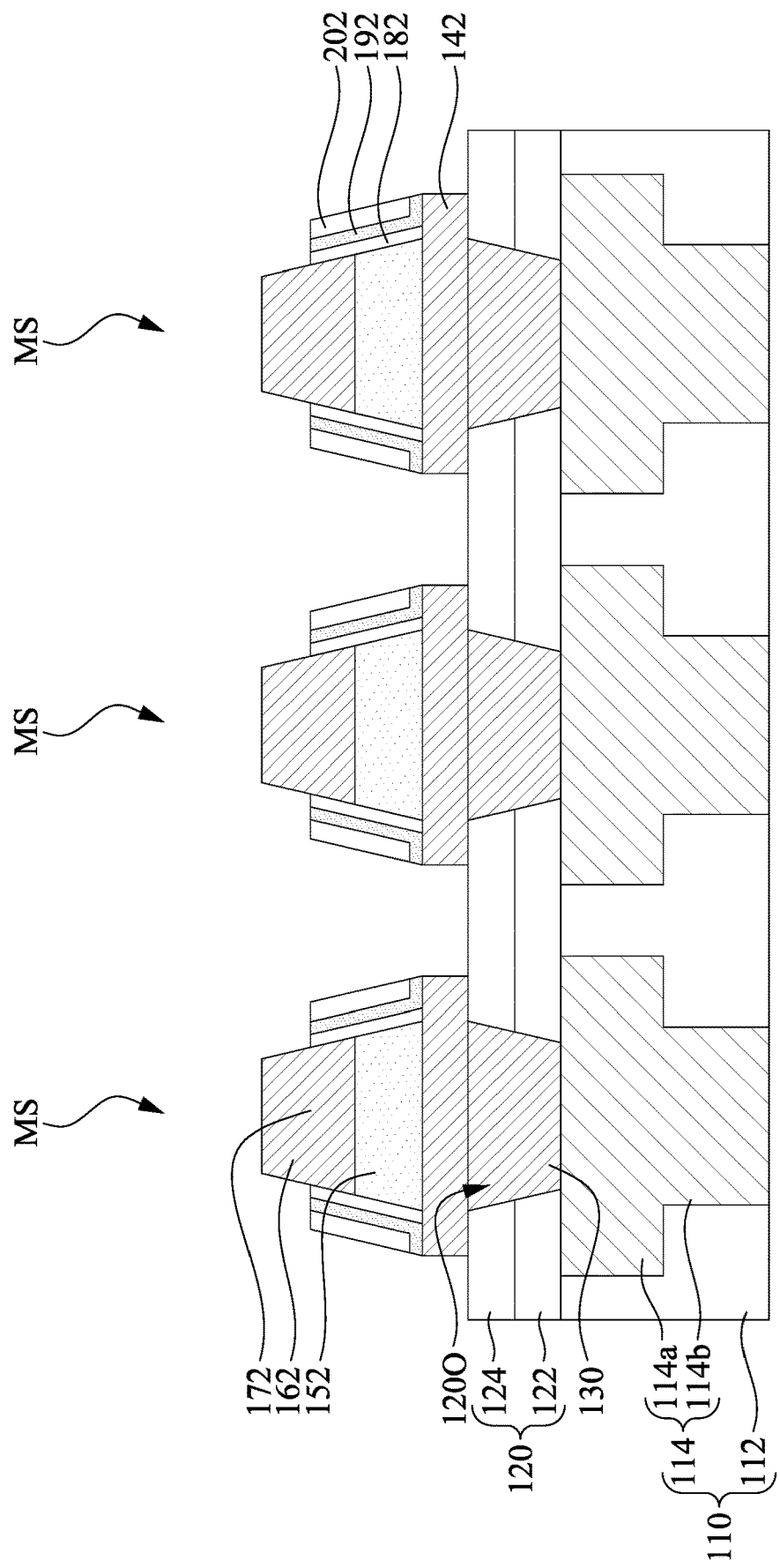

Reference is made to FIG. 19. The magnetic shielding layer 190 and the bottom electrode layer 140 (referring to FIG. 18) are respectively patterned into magnetic shielding elements 192 and bottom electrodes 142 by suitable etching process. The bottom electrodes 142 are in contact with the BEVAs 130. The magnetic shielding layer 190 and the bottom electrode layer 140 (referring to FIG. 18) can be patterned using the second spacer 202 as an etch mask, and hence the magnetic shielding layer 190 and the bottom electrode layer 140 (referring to FIG. 18) can be patterned in a self-aligned manner. In some embodiments, the patterning process may include one or more etching operations, such as dry etching, wet etching or a combination thereof. In some embodiments, the patterning process may include a dry etching using chlorine based, fluorine based, or oxygen containing gaseous etchant such as CO, $O_2$, $CO_2$, $CF_4$, $CH_2F_2$, $C_4F_8$, $NF_3$, $SF_6$, $Cl_2$, $BCl_3$ and/or other chemicals, as example. In some embodiments, the second spacer 202 have a higher etch resistance to the etching process than that of the magnetic shielding elements 192 and the bottom electrodes 142, such that the resistance switching element 152 may be protected from being etched during the patterning the magnetic shielding layer 190 and the bottom electrode layer 140 (referring to FIG. 18). In some embodiments, the metal-containing masks 172 may be consumed by the etching process. In some embodiments, a combination of the bottom electrodes 142 and the memory stacks MS may be referred to as a memory cell MC, such as MRAM cell.

Figure 20:
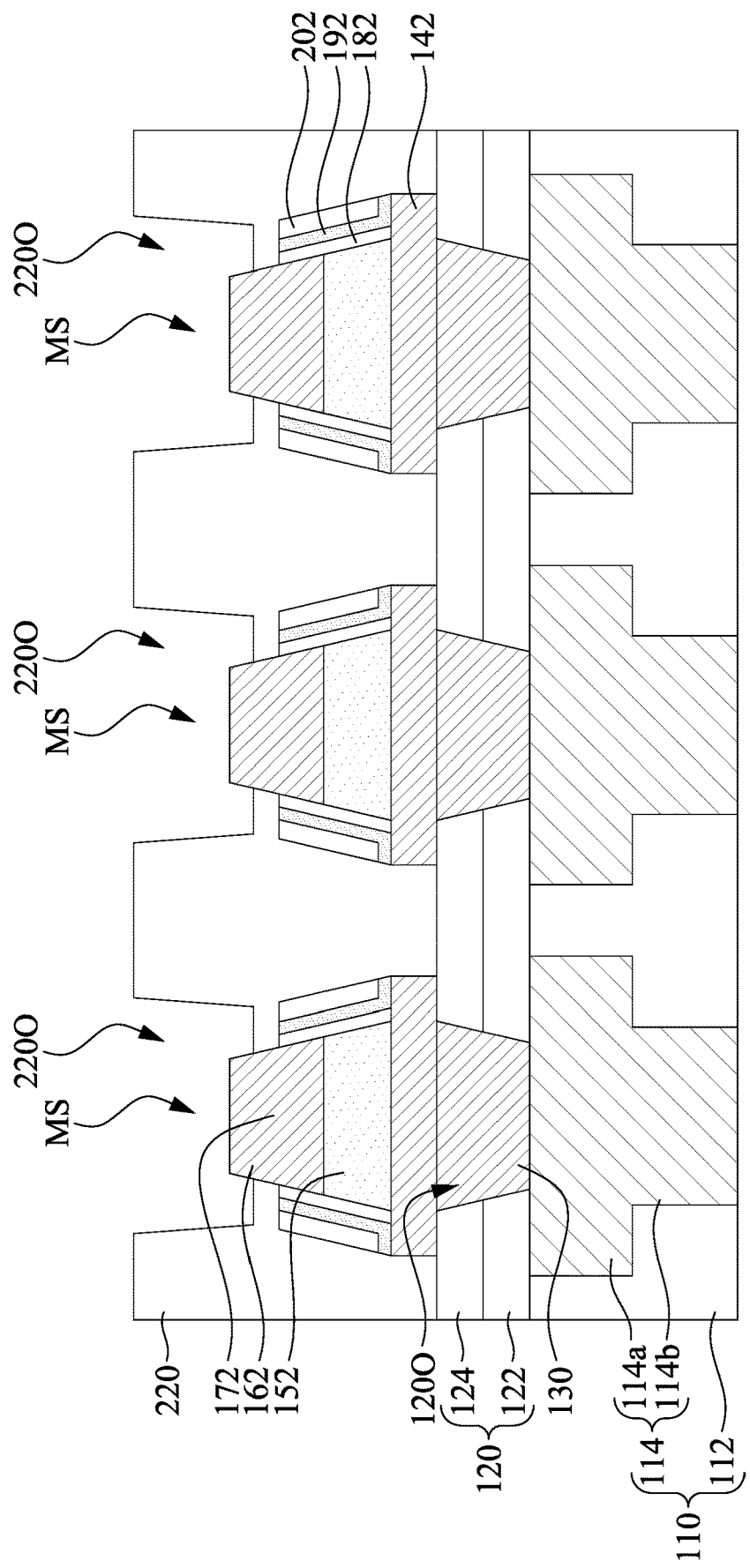

Reference is made to FIG. 20. An ILD layer 220 is formed over the structure of FIG. 19, and then openings 230O are etched in the ILD layer 220. Depending on the profile of the metallization pattern subsequently formed in the openings 230O, the openings 230O may be a via opening, a trench opening, or the combination thereof. The openings 230O may be etched such that the magnetic shielding elements 192 are not exposed. For example, etch parameters (e.g., etch time) may be controlled such that the ILD layer 220 over the magnetic shielding elements 192 is not entirely etched away. Through the configuration, after etching the openings 230O, a portion of the ILD layer 220 or other dielectric material remains covering top surfaces of the magnetic shielding elements 192 and spacers 182 and 202. For example, a bottom of the openings 230O is higher than the top surfaces of the magnetic shielding elements 192.

Figure 21:
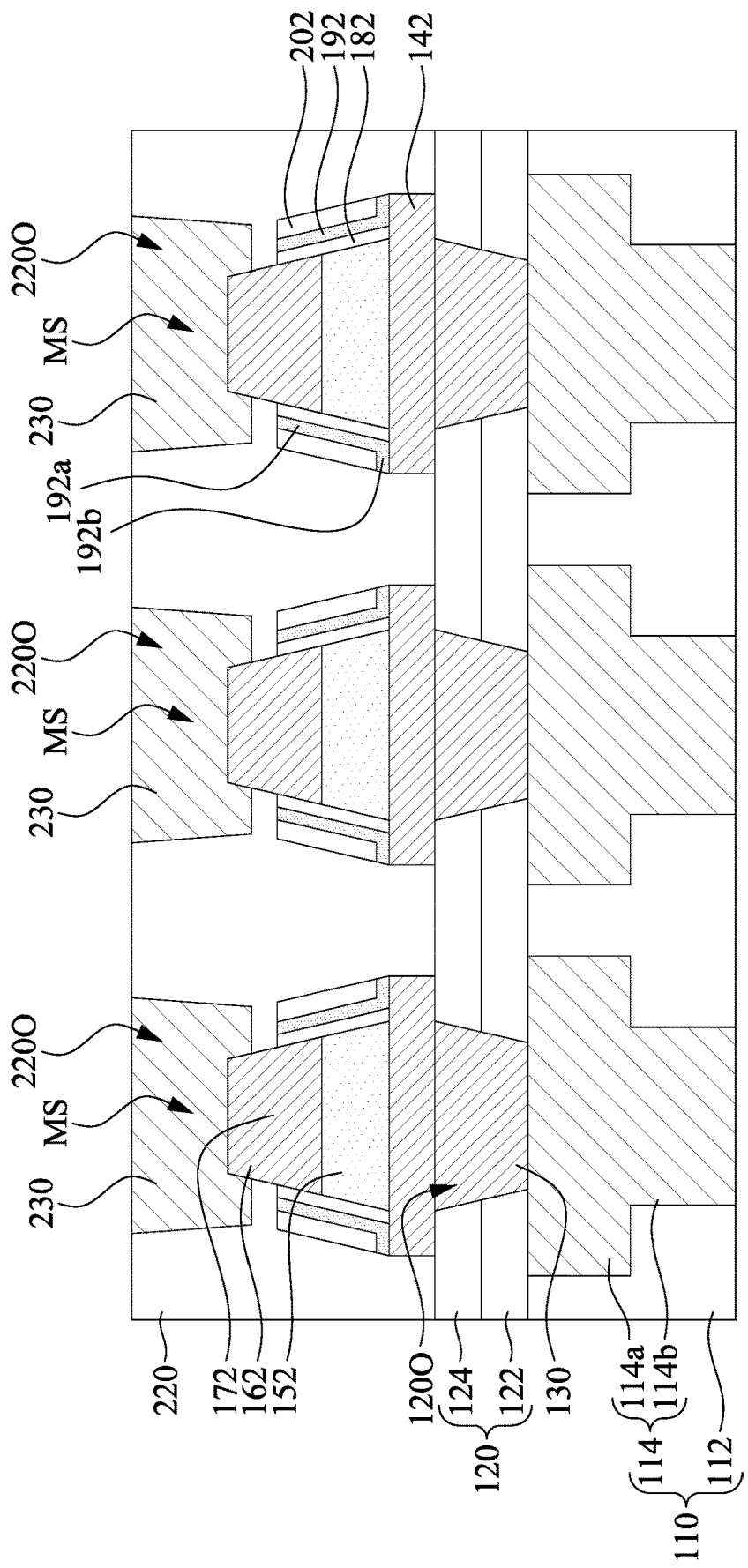

Reference is made to FIG. 21. A metallization pattern 230 is then formed in the openings 2200 the ILD layer 220. The metallization pattern 230 may be spaced apart from the magnetic shielding elements 192 by the portion of ILD layer 220 or other dielectric materials. In the present embodiments, the metallization pattern 230 include conductive lines connected to the top electrodes 162, and does not include a conductive via intervened between conductive lines and the top electrodes 162. In some other embodiments, the metallization pattern 230 may include conductive vias, conductive lines, or the combination thereof.

The magnetic shielding elements 192 may be located between the first and second spacers 182 and 202. In some embodiments, the first spacers 182 space the magnetic shielding elements 192 apart from the top electrodes 162, and the second spacers 202 serves as an etch mask during patterning the magnetic shielding layer 190 and the bottom electrode layer 140 (referring to FIGS. 18-19). Through the configuration, the magnetic shielding elements 192 may be in contact with the bottom electrodes 142, but not establish an electrical connection between the bottom electrodes 142 and the top electrodes 162 or an electrical connection between the bottom electrodes 142 and the metallization pattern 230.

In some embodiments, the top electrode 162 and the resistance switching element 152 are over a first portion of the bottom electrode 142, the magnetic shielding element 192 is over a second portion of the bottom electrode 142. In the present embodiments, the first spacer 182 may space the portion 192a of the magnetic shielding element 192 apart from the sidewall of the resistance switching element 152, and the portion 192b of the magnetic shielding element 192 may be in contact with the top surface of the second portion of the bottom electrode 142. Other details of the embodiments in FIGS. 14-21 are similar to those illustrated in the embodiments of FIGS. 2-13, and therefore not repeated herein.

Figure 22:
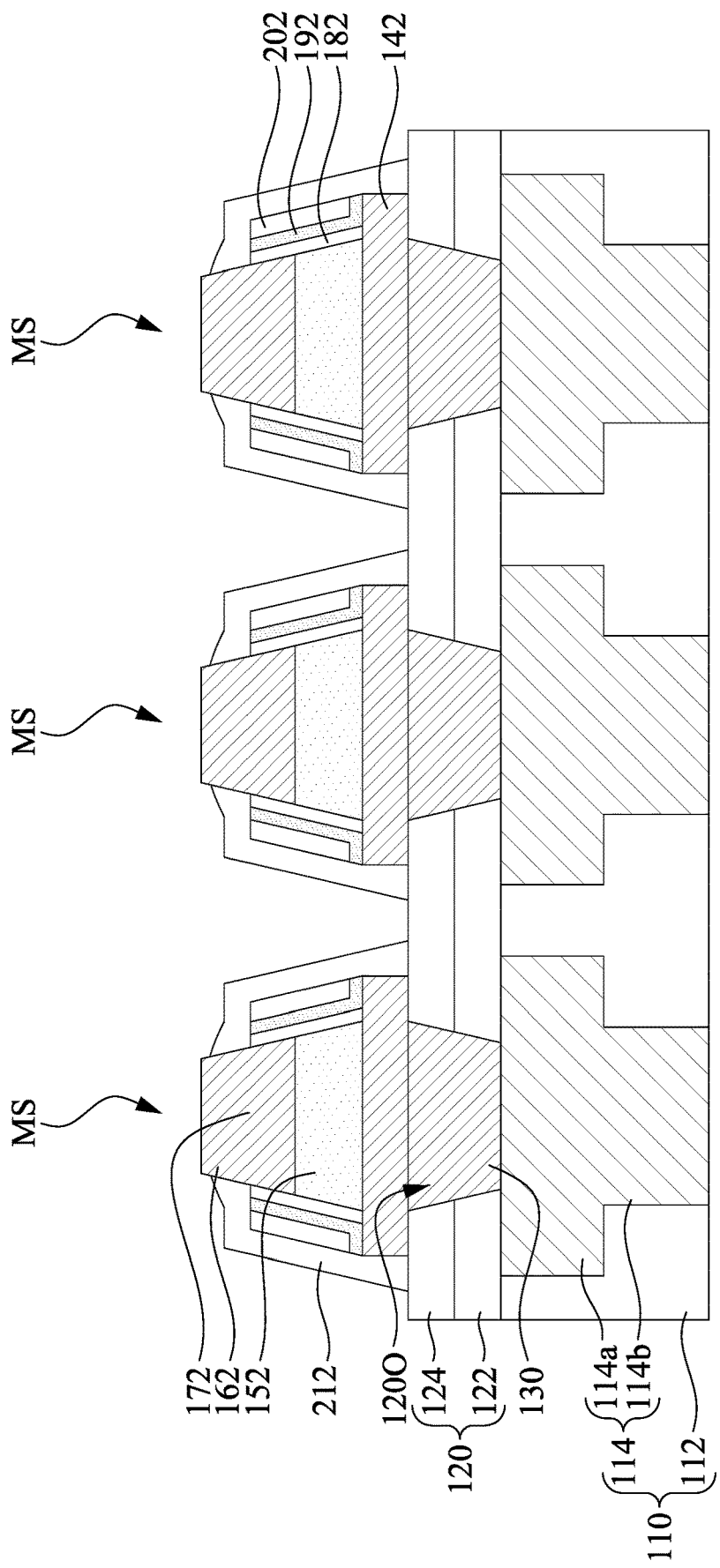
FIGS. 22 and 23 are cross-sectional views of an integrated circuit device in various stages of fabrication in accordance with some embodiments of the present disclosure.
Figure 23:
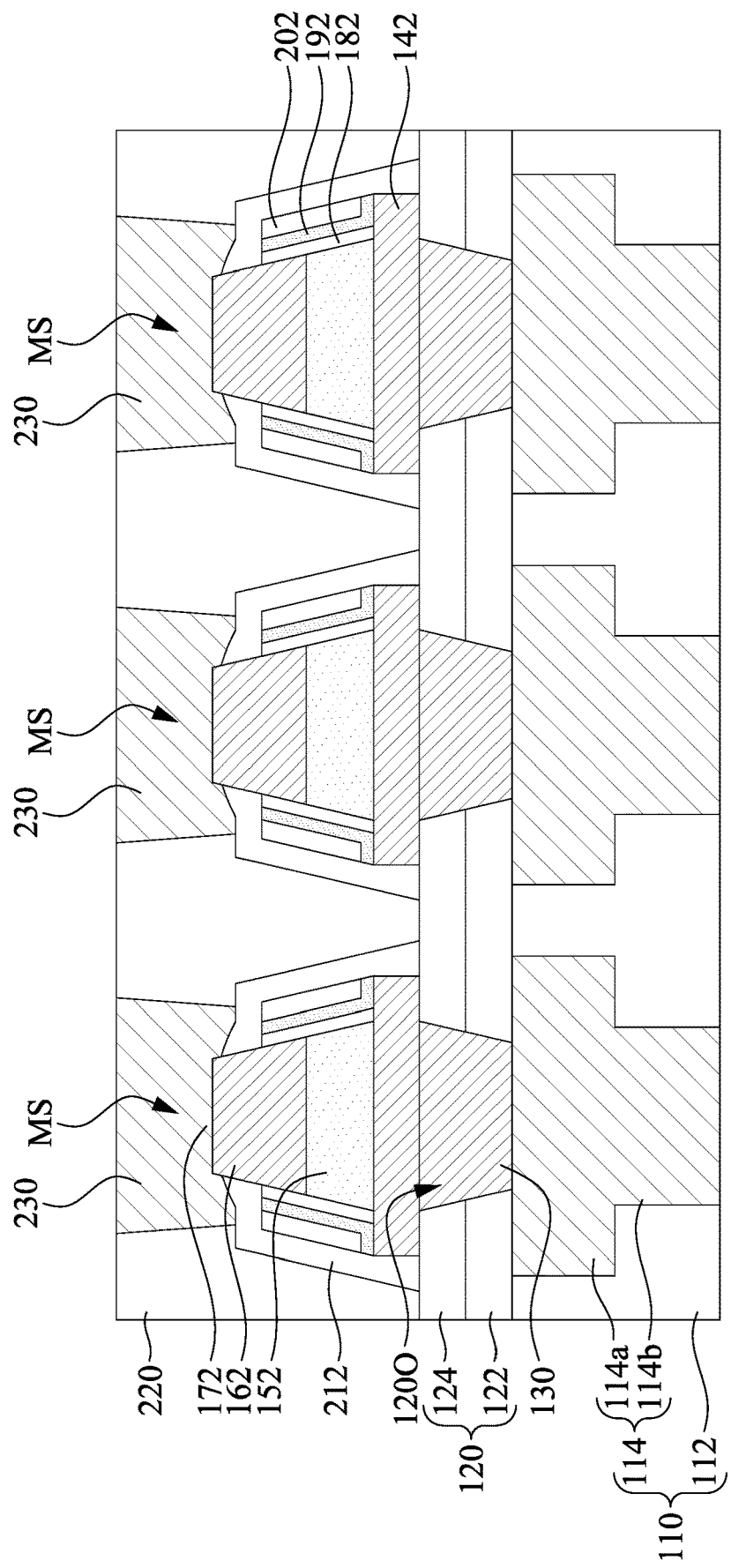

FIGS. 22 and 23 are cross-sectional views of an integrated circuit device in various stages of fabrication in accordance with some embodiments of the present disclosure. The present embodiments are similar to those illustrated in FIGS. 14-21, except that third spacers 212 are formed around the memory stacks MS prior to forming the ILD layer 220. The illustration is merely exemplary and is not intended to limit beyond what is specifically recited in the claims that follow. It is understood that additional operations may be provided before, during, and after the operations shown by FIGS. 2-14, and some of the operations described below can be replaced or eliminated for additional embodiments of the method. The order of the operations/processes may be interchangeable.

Reference is made to FIG. 22. Third spacers 212 are formed around the memory stacks MS, respectively. The third spacer 212 may be made of non-magnetic material. The third spacer 212, in some embodiments may include SiN, but in other embodiments may include SiC, SiON, silicon oxycarbide (SiOC), the like, and/or combinations thereof. The formation of the third spacers 212 comprises depositing a third spacer layer over the structure of FIG. 20, and patterning the third spacer layer into the third spacers 212. In some other embodiments, the deposited third spacer layer may be free of being patterned, such that the third spacers 212 respectively around the memory stacks MS are continuously connected with each other.

Reference is made to FIG. 23. An ILD layer 220 is formed over the structure of FIG. 22, and then a metallization pattern 230 is then formed in the ILD layer 220.

In the present embodiments, the third spacers 212 space the magnetic shielding elements 192 apart from the metallization pattern 230. Similar to those illustrated above, the first spacers 182 space the magnetic shielding elements 192 apart from the top electrodes 162, the second spacers 202 serves as an etch mask during patterning the magnetic shielding layer 190 and the bottom electrode layer 140 (referring to FIGS. 18-19). Through the configuration, the magnetic shielding elements 192 may be in contact with the bottom electrodes 142, but not establish an electrical connection between the bottom electrodes 142 and the top electrodes 162 or an electrical connection between the bottom electrodes 142 and the metallization pattern 230. The third spacers 212 are not over the bottom electrodes 142 in the present embodiments. For example, bottoms of the third spacers 212 are lower than a top surface of the bottom electrode 142. The third spacer 212 may be in contact with a top surface of the dielectric layer 120. Other details of the embodiments in FIGS. 22 and 23 are similar to those illustrated in the embodiments of FIGS. 14-21, and therefore not repeated herein.

Figure 24:
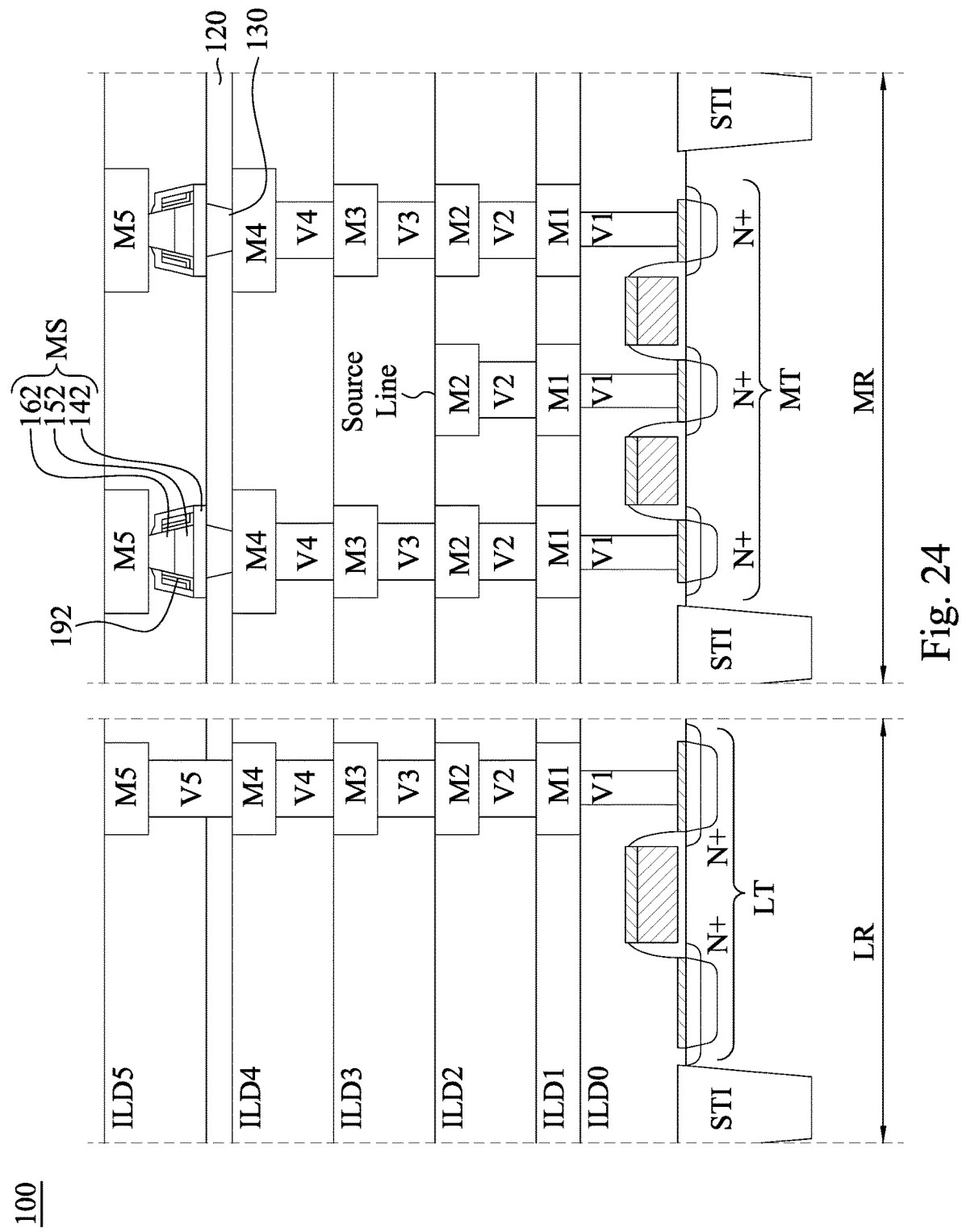
FIG. 24 is a cross-sectional view of another integrated circuit device in accordance with some embodiments of the present disclosure.

FIG. 24 is a cross-sectional view of another integrated circuit device in accordance with some embodiments of the present disclosure. The integrated circuit includes a logic region 900 and a memory region 910. Logic region 900 may include circuitry, such as the exemplary transistor 902, for processing information received from memory cells MC in the memory region 910 and for controlling reading and writing functions of memory cells MC. In some embodiments, the memory cells MC includes a bottom electrode 142, a resistance switching element 152 over the bottom electrode 142, a top electrode 162 over the resistance switching element 152. In some embodiments, each of the memory cells MC are surrounded by a magnetic shielding element 192.

As depicted, the integrated circuit is fabricated using six metallization layers, labeled as M1 through M5, with five layers of metallization vias or interconnects, labeled as V1 through V5. Other embodiments may contain more or fewer metallization layers and a corresponding more or fewer number of vias. Logic region 900 includes a full metallization stack, including a portion of each of metallization layers M1-M5 connected by interconnects V2-V5, with the interconnect V1 connecting the stack to a source/drain contact of logic transistor 902. The memory region 910 includes a full metallization stack connecting memory cells MC to transistors 912 in the memory region 910, and a partial metallization stack connecting a source line to transistors 912 in the memory region 910. Memory cells MC are depicted as being fabricated in between the top of the metallization layer M4 and the bottom of the metallization layer M5. The metallization layer M4 is connected with the bottom electrode 924 through a BEVA 130 in a dielectric layer 120, and the metallization layer M5 is connected with the top electrode 162. Six ILD layers, identified as ILD0 through ILD5 are depicted in FIG. 24 as spanning the logic region 900 and the memory region 910. The ILD layers may provide electrical insulation as well as structural support for the various features of the integrated circuit during many fabrication process steps.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that magnetic shielding elements are respectively disposed to surrounding memory cells, thereby boosting the magnetic immunity. For example, magnetic field flux/lines are directed to pass more through the magnetic shielding elements, less through the memory cells. Therefore, the magnetic shielding elements mitigates the adverse effects of external turbulent and in-cell magnetic cross talk. Another advantage is that it is easy to integrate the magnetic shielding material in MRAM process loop. Still another advantage is that the fabrication process can be performed with much low cost reduction compared to shielding in package level.

According to some embodiments of the present disclosure, an integrated circuit device includes a substrate, a memory cell, a magnetic shielding element, an interlayer dielectric layer, and a metallization pattern. The memory cell is over the substrate. The memory cell includes a bottom electrode, a resistance switching element over the bottom electrode, a top electrode over the resistance switching element. The magnetic shielding element is around the memory cell. The interlayer dielectric layer surrounds the memory cell and the magnetic shielding element. The metallization pattern is in the interlayer dielectric layer and connected to the top electrode.

According to some embodiments of the present disclosure, an integrated circuit device includes a substrate, a memory cell, a magnetic shielding element, an interlayer dielectric layer, and a metallization pattern. The bottom electrode is over the substrate. The resistance switching element is over a first portion of the bottom electrode. The top electrode is over the resistance switching element. The magnetic shielding element is over a second portion of the bottom electrode. The interlayer dielectric layer surrounds the bottom electrode, the resistance switching element, the top electrode, and the magnetic shielding element. The metallization pattern is in the interlayer dielectric layer and connected to the top electrode.

According to some embodiments of the present disclosure, a method for fabricating an integrated circuit device is provided. The method includes forming a memory cell over a substrate, wherein the memory cell comprises a bottom electrode, a resistance switching element over the bottom electrode, a top electrode over the resistance switching element; forming a magnetic shielding element around the memory cell; depositing an interlayer dielectric layer around the memory cell and the magnetic shielding element; and forming a metallization pattern in the interlayer dielectric layer and connected to the top electrode.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit device, comprising:
a substrate;
a memory cell over the substrate, wherein the memory cell comprises a bottom electrode, a resistance switching element over the bottom electrode, a top electrode over the resistance switching element;
a magnetic shielding element around the memory cell, wherein a top of the magnetic shielding element is lower than a top surface of the top electrode, and the magnetic shielding element is in contact with the bottom electrode;
an interlayer dielectric layer surrounding the memory cell and the magnetic shielding element; and
a metallization pattern in the interlayer dielectric layer and connected to the top electrode.

2. The integrated circuit device of claim 1, further comprising:
a first spacer between the magnetic shielding element and the memory cell, wherein the first spacer spaces the magnetic shielding element apart from the top electrode and the resistance switching element.

3. The integrated circuit device of claim 1, further comprising:
a first spacer between the magnetic shielding element and the memory cell, wherein the first spacer spaces the magnetic shielding element apart from the bottom electrode.

4. The integrated circuit device of claim 1, further comprising:
a second spacer around the magnetic shielding element and the memory cell, wherein the second spacer spaces the magnetic shielding element apart from the metallization pattern.

5. The integrated circuit device of claim 4, wherein a bottom of the second spacer is lower than a top surface of the bottom electrode.

6. The integrated circuit device of claim 4, wherein a bottom of the second spacer is over a top surface of the bottom electrode.

7. The integrated circuit device of claim 1, wherein the top of the magnetic shielding element is higher than a top surface of the resistance switching element.

8. The integrated circuit device of claim 1, wherein the top of the magnetic shielding element is lower than a bottom surface of the metallization pattern.

9. An integrated circuit device, comprising:
a substrate;
a bottom electrode over the substrate;
a resistance switching element over a first portion of the bottom electrode;
a top electrode over the resistance switching element;
a magnetic shielding element over and in contact with a second portion of the bottom electrode;
an interlayer dielectric layer surrounding the bottom electrode, the resistance switching element, the top electrode, and the magnetic shielding element; and
a metallization pattern in the interlayer dielectric layer and connected to the top electrode.

10. The integrated circuit device of claim 9, wherein the magnetic shielding element has a first portion extending along a top surface of the second portion of the bottom electrode and a second portion extending along a sidewall of the resistance switching element.

11. The integrated circuit device of claim 10, further comprising:
a first spacer spacing the first portion of the magnetic shielding element apart from the top surface of the second portion of the bottom electrode, and spacing the second portion of the magnetic shielding element apart from the sidewall of the resistance switching element.

12. The integrated circuit device of claim 10, further comprising:
a first spacer spacing the second portion of the magnetic shielding element apart from the sidewall of the resistance switching element, wherein the first portion of the magnetic shielding element is in contact with the top surface of the second portion of the bottom electrode.

13. The integrated circuit device of claim 10, further comprising:
a second spacer over the first portion of the magnetic shielding element, wherein a top of the magnetic shielding element is free of coverage of the second spacer.

14. The integrated circuit device of claim 9, further comprising:
a third spacer over a third portion of the bottom electrode, wherein the third spacer covers a top of the magnetic shielding element, and the second portion of the bottom electrode is between the first and third portions of the bottom electrode.

15. The integrated circuit device of claim 14, further comprising:
a dielectric layer below the bottom electrode; and
a bottom electrode via in the dielectric layer and connected to the bottom electrode, wherein the third spacer is in contact with a top surface of the dielectric layer.

16. A method for fabricating an integrated circuit device, the method comprising:
forming a memory cell over a substrate, wherein the memory cell comprises a bottom electrode, a resistance switching element over the bottom electrode, a top electrode over the resistance switching element;
depositing a magnetic shielding layer around the memory cell, wherein the magnetic shielding layer has a first portion over the memory cell and a second portion over a sidewall of the memory cell;
removing the first portion of the magnetic shielding layer and an upper part of the second portion of the magnetic shielding layer from the memory cell, wherein a lower part of the second portion of the magnetic shielding layer remains and forms a magnetic shielding element after removing the first portion of the magnetic shielding layer and the upper part of the second portion of the magnetic shielding layer from the memory cell;
depositing an interlayer dielectric layer around the memory cell and the magnetic shielding element; and
forming a metallization pattern in the interlayer dielectric layer and connected to the top electrode.

17. The method of claim 16, further comprising:
forming a first spacer, wherein depositing the magnetic shielding layer is performed such that the first spacer spaces the magnetic shielding element from the memory cell.

18. The method of claim 16, further comprising:
forming a second spacer, wherein forming the metallization pattern is performed such that the second spacer spaces the magnetic shielding element from the metallization pattern.

19. The method of claim 16, wherein the upper part of the first portion of the magnetic shielding layer is spaced apart from the top electrode of the memory cell.

20. The method of claim 16, wherein the upper part of the first portion of the magnetic shielding layer is in contact with the top electrode of the memory cell.

* * * * *